(12) United States Patent
Nishimura et al.

(10) Patent No.: US 9,634,641 B2
(45) Date of Patent: Apr. 25, 2017

(54) ELECTRONIC MODULE HAVING AN INTERCONNECTION SUBSTRATE WITH A BURIED ELECTRONIC DEVICE THEREIN

(71) Applicant: TAIYO YUDEN CO., LTD., Tokyo (JP)

(72) Inventors: Gohki Nishimura, Tokyo (JP); Takuma Kuroyanagi, Tokyo (JP); Naoyuki Tasaka, Tokyo (JP); Sachiko Tanaka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 117 days.

(21) Appl. No.: 14/524,857

(22) Filed: Oct. 27, 2014

(65) Prior Publication Data

US 2015/0123744 A1    May 7, 2015

(30) Foreign Application Priority Data

Nov. 6, 2013 (JP) .................................. 2013-230714
Nov. 6, 2013 (JP) .................................. 2013-230715

(51) Int. Cl.
*H03H 9/05* (2006.01)
*H03H 9/10* (2006.01)
(Continued)

(52) U.S. Cl.
CPC .......... *H03H 9/0566* (2013.01); *H03H 9/059* (2013.01); *H03H 9/0514* (2013.01);
(Continued)

(58) Field of Classification Search
CPC .... H03H 9/0571; H03H 9/0576; H03H 9/173; H03H 9/706; H03H 9/725; H03H 9/0566;
(Continued)

(56) References Cited

U.S. PATENT DOCUMENTS 6,974,724 B2 * 12/2005 Hyvonen ............ H01L 23/5389
257/659
7,863,699 B2 * 1/2011 Dropmann .............. H01L 23/66
257/254
(Continued)

FOREIGN PATENT DOCUMENTS

CN       1977450 A      6/2007
JP   2008-546207 A    12/2008
(Continued)

OTHER PUBLICATIONS

Chinese Office Action dated Jan. 20, 2017 in a counterpart Chinese patent application No. 20140601629.1.

*Primary Examiner* — Robert Pascal
*Assistant Examiner* — Jorge Salazar, Jr.
(74) *Attorney, Agent, or Firm* — Chen Yoshimura LLP

(57) ABSTRACT

An electronic device includes: a first substrate, a first function part in its first surface, an adhesive layer on the first surface so as to surround the first function part, a second substrate bonded to the first substrate by the adhesive layer to form a gap between the first and second substrates, a first via interconnection piercing the first substrate to connect the first surface and an opposite second surface, a second via interconnection piercing the second substrate to connect a third surface of the second substrate opposite to the first substrate and a fourth surface opposite to the third surface, a first terminal provided on the second surface and connected to the first via interconnection, a second terminal provided on the fourth surface and connected to the second via interconnection. The first function part is connected to at least one of the first and second via interconnections.

15 Claims, 27 Drawing Sheets

(51) Int. Cl.
*H03H 9/70* (2006.01)
*H03H 9/72* (2006.01)
*H03H 9/17* (2006.01)

(52) U.S. Cl.
CPC ........ *H03H 9/0571* (2013.01); *H03H 9/0576* (2013.01); *H03H 9/10* (2013.01); *H03H 9/1007* (2013.01); *H03H 9/1064* (2013.01); *H03H 9/173* (2013.01); *H03H 9/706* (2013.01); *H03H 9/725* (2013.01)

(58) Field of Classification Search
CPC .... H03H 9/0514; H03H 9/059; H03H 9/0557; H03H 9/10; H03H 9/1007; H03H 9/1064
USPC .......................... 333/133, 187, 188, 193–196
See application file for complete search history.

(56) References Cited

U.S. PATENT DOCUMENTS

| | | | |
|---|---|---|---|
| 8,130,507 B2* | 3/2012 | Origuchi | H01L 23/49838 174/260 |
| 8,723,621 B2* | 5/2014 | Kidoh | H03H 9/1064 333/133 |
| 2003/0000067 A1* | 1/2003 | Hori | H01L 24/97 29/592.1 |
| 2005/0104685 A1* | 5/2005 | Kuroki | H04B 1/0057 333/133 |
| 2005/0245001 A1 | 11/2005 | Hyvonen et al. | |
| 2006/0012021 A1* | 1/2006 | Larson, III | H03B 5/326 257/692 |
| 2006/0049995 A1 | 3/2006 | Imaoka et al. | |
| 2007/0115079 A1* | 5/2007 | Kubo | B81C 1/00238 333/189 |
| 2009/0224851 A1 | 9/2009 | Feiertag et al. | |
| 2009/0289722 A1 | 11/2009 | Dropmann et al. | |
| 2012/0049978 A1* | 3/2012 | Pang | H03H 9/0571 333/189 |
| 2012/0154072 A1* | 6/2012 | Bae | H03H 9/0557 333/133 |
| 2013/0162367 A1 | 6/2013 | Tanaka et al. | |
| 2014/0118084 A1 | 5/2014 | Takemura | |
| 2014/0204549 A1 | 7/2014 | Tanaka et al. | |

FOREIGN PATENT DOCUMENTS

| | | |
|---|---|---|
| JP | 2013-132014 A | 7/2013 |
| WO | 2013/008435 A1 | 1/2013 |

\* cited by examiner

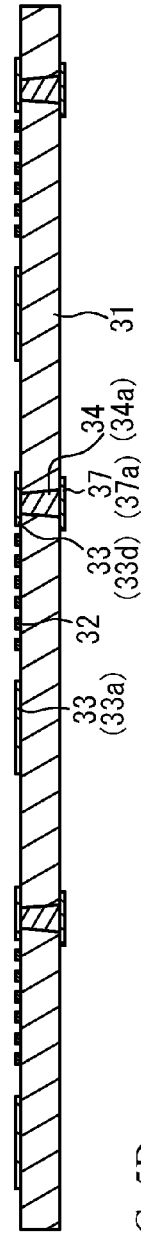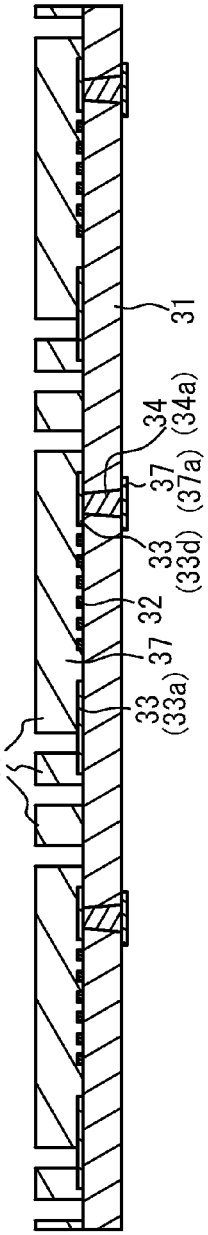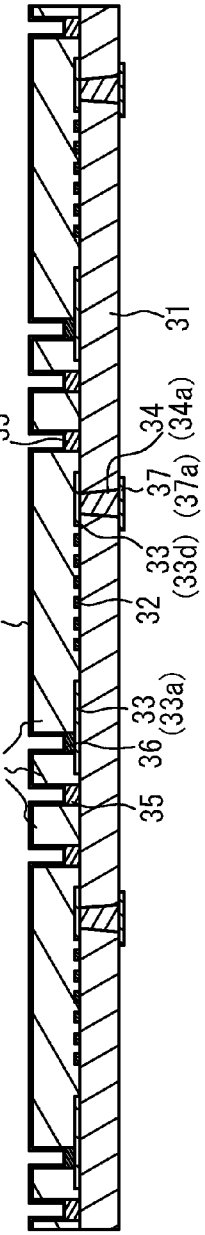

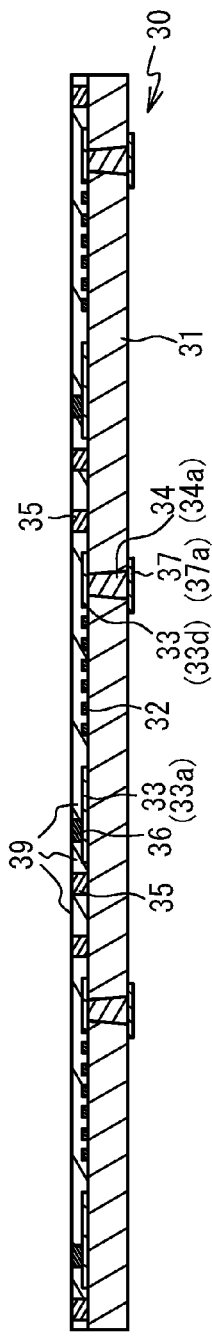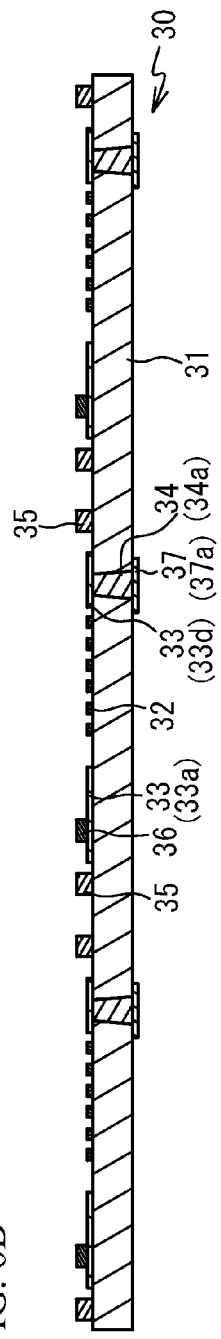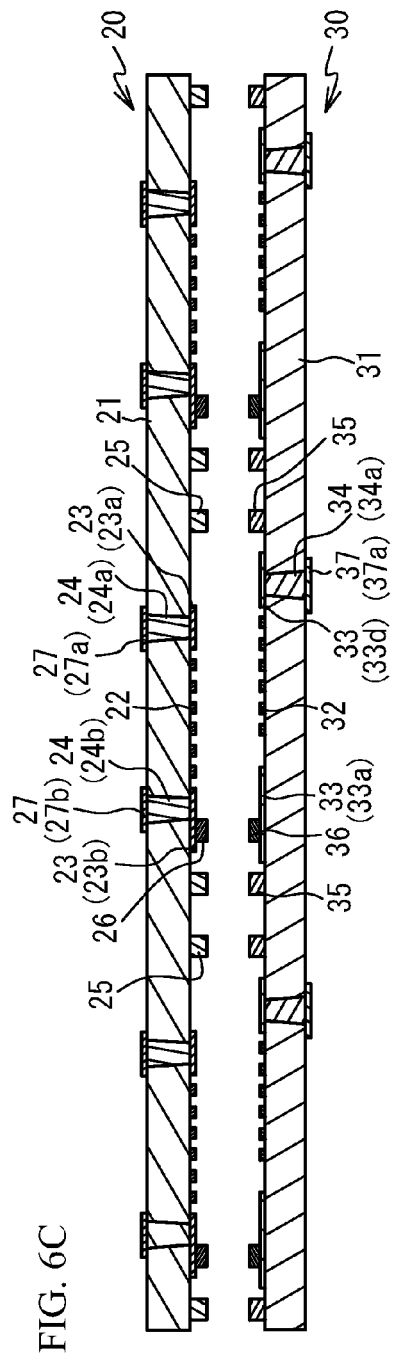

ELECTRONIC MODULE HAVING AN INTERCONNECTION SUBSTRATE WITH A BURIED ELECTRONIC DEVICE THEREIN

CROSS-REFERENCE TO RELATED APPLICATION

This application is based upon and claims the benefit of priority of the prior Japanese Patent Application Nos. 2013-230714 and 2013-230715, filed on Nov. 6, 2013, the entire contents of which are incorporated herein by reference.

FIELD

A certain aspect of the present invention relates to an electronic device and a module.

BACKGROUND

An electronic device such as an acoustic wave device that functions as a filter or a duplexer, for example, is mounted in a communication device such as a cellular phone. The function part of the acoustic wave device excites acoustic waves and is therefore exposed to an opening. Japanese Patent Application Publication No. 2008-546207 discloses a technique in which two substrates are bonded together so as to form a gap therebetween and a device structure is provided in the gap.

A module mounted in a communication device such as a cellular phone includes an acoustic wave device that functions as a filter or a duplexer, for example. Japanese Patent Application Publication No. 2013-132014 discloses an arrangement in which a filter chip is buried in a substrate. This arrangement improves the degree of integration and enables downsizing of the module.

Terminals for inputting and outputting signals to and from the function part are provided on a single main surface of a substrate. However, the distances between the adjacent terminals on the single surface of the electronic device are small, and therefore, interference may occur therebetween. The interference deteriorates the electrical performance of the electronic device.

On a substrate, there are provided interconnections that connect terminals of an acoustic wave device built in the substrate and terminals on the substrate together. If the terminals are provided on only one of the opposite surfaces of the acoustic wave device, the interconnections are caused to bypass the acoustic wave device. However, the routing of the interconnections around the acoustic wave device increases the area occupied by the interconnections and decreases the design flexibility.

SUMMARY OF THE INVENTION

According to an aspect of the present invention, there is provided an electronic device and a module having a function part exposed to an opening and having a structure capable of suppressing deterioration of the electric performance.

According to another aspect of the present invention, there is provided a module having improved design flexibility.

According to yet another aspect of the present invention, there is provided an electronic device including: a first substrate; a first function part formed in a first surface of the first substrate; an adhesive layer formed on the first surface so as to surround the first function part; a second substrate that is bonded to the first substrate by the adhesive layer so as to form a gap between the first and second substrates; a first via interconnection that pierces the first substrate to connect the first surface and a second surface of the first substrate opposite to the first surface together; a second via interconnection that pierces the second substrate to connect a third surface of the second substrate opposite to the first substrate and a fourth surface of the second substrate opposite to the third surface together; a first terminal that is provided on the second surface and is connected to the first via interconnection; and a second terminal that is provided on the fourth surface and is connected to the second via interconnection, the first function part being connected to at least one of the first via interconnection and the second via interconnection.

According to a further aspect of the present invention, there is provided a module including: an interconnection substrate in which the above electronic device is buried; a fifth terminal that is provided on a fifth surface of the interconnection substrate closer to the second surface and is connected to the first terminal; and a sixth terminal that is provided on a sixth surface of the interconnection substrate closer to the fourth surface and is connected to the second terminal.

According to a still further aspect of the present invention, there is provided a module including: an interconnection substrate having an upper surface on which the above electronic device is flip-chip mounted; a seventh terminal that is provided on the upper surface of the interconnection substrate and is connected to one of the first and second terminals; and a component that is mounted on the electronic device and is connected to the other of the first and second terminals.

According to another aspect of the present invention, there is provided a module including: an interconnection substrate; an acoustic wave device buried in the interconnection substrate; a first terminal provided on a first surface of the acoustic wave device; a second terminal provided on a second surface of the acoustic wave device opposite to the first surface; a third terminal provided on a third surface of the interconnection substrate closer to the first surface and is connected to the first terminal; and a fourth terminal provided on a fourth surface of the interconnection substrate closer to the second surface and is connected to the second terminal.

BRIEF DESCRIPTION OF THE DRAWINGS

FIG. 5A through 5E are cross-sectional views that illustrate an exemplary method for fabricating a duplexer;

FIGS. 6A through 6C are cross-sectional views of steps that follow those of FIGS. 5A through 5E;

DETAILED DESCRIPTION

A description is now given of embodiments of the present invention in conjunction with the accompanying drawings.

First Embodiment

Figure 1:
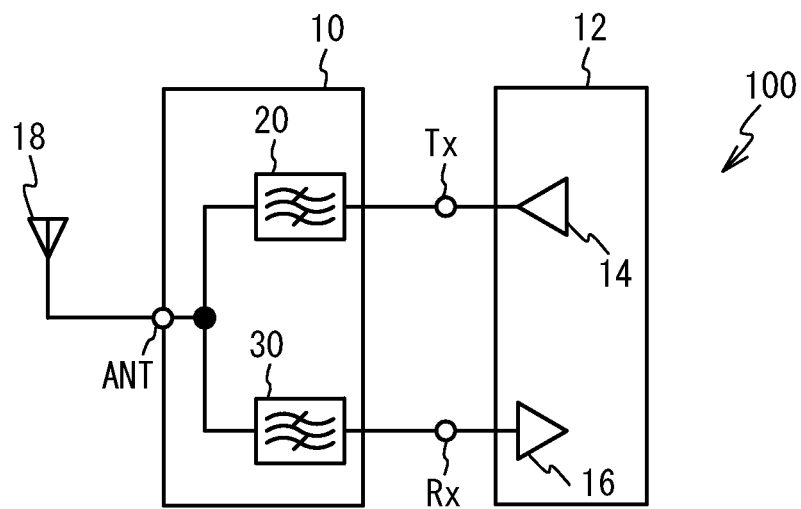
FIG. 1 is a block diagram of an exemplary module.

FIG. 1 is a block diagram of a module 100 in accordance with a first embodiment. Referring to FIG. 1, the module 100 includes a duplexer 10 and an IC 12. The duplexer 10 includes a transmit filter 20 and a receive filter 30. The pass band of the transmit filter 20 is different from the pass band of the receive filter 30. The IC 12 includes a power amplifier (PA) 14 and a low noise amplifier (LNA) 16. The transmit filter 20 is connected to an antenna 18 through an antenna terminal ANT, and is connected to the PA 14 through a transmit terminal Tx. The receive filter 30 is connected to the antenna 18 through the antenna terminal ANT, and is connected to the LNA 16 via a receive terminal Rx.

A transmit signal is amplified by the PA 14, filtered by the transmit filter 20, and is transmitted from the antenna 18. A receive signal is received by the antenna 18, filtered by the receive filter 30 and is amplified by the LNA 16. The transmit signal and the receive signal are RF signals in the W-CDMA (Wideband Code Division Multiple Access) band, for example. The duplexer 10 is formed as a single chip.

Figure 2A:
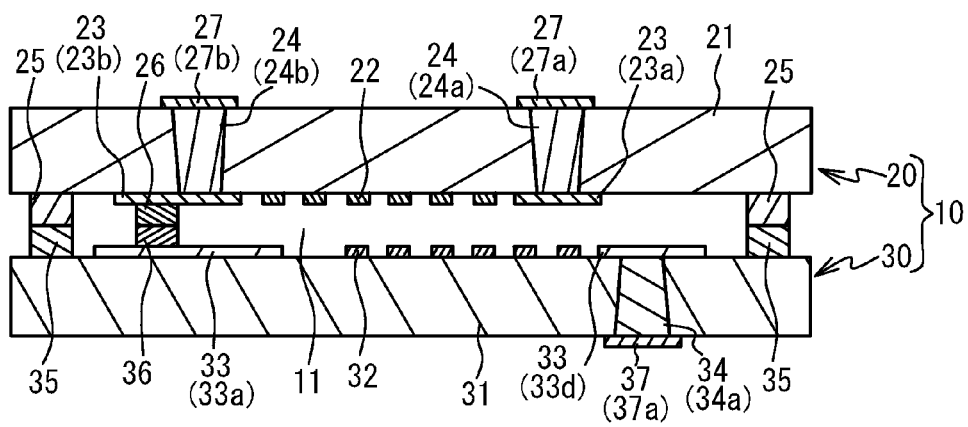
FIGS. 2A and 2B are cross-sectional views of an exemplary duplexer.
Figure 2B:
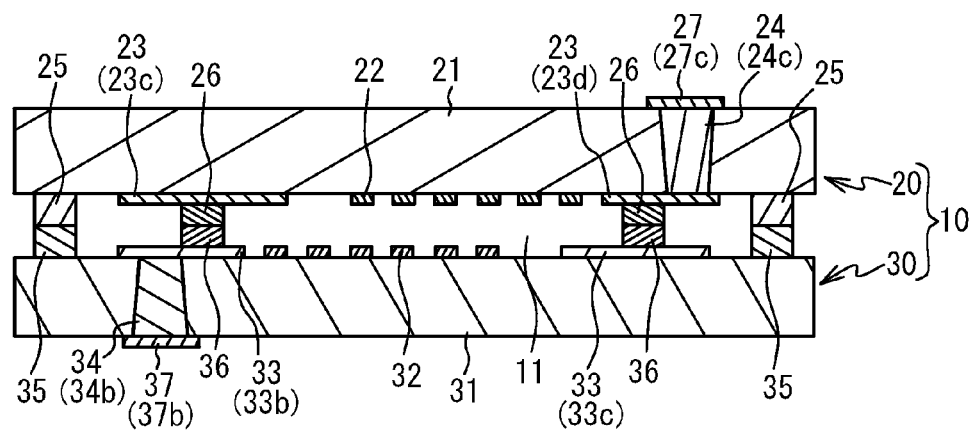

FIGS. 2A and 2B are cross-sectional views of an exemplary structure of the duplexer 10 (electronic device). More specifically, FIG. 2A is a cross-sectional view taken along a line A-A depicted in FIGS. 3A and 3B, which will be described later, and FIG. 2B is a cross-sectional view taken along a line B-B in FIGS. 3A and 3B.

As illustrated in FIGS. 2A and 2B, the duplexer 10 includes a chip type of transmit filter 20 and a chip type of receive filter 30, which are stacked together. The transmit filter 20 includes a piezoelectric substrate 21, an IDT (Inter-Digital Transducer) 22, a conductive layer 23, via interconnections 24, an adhesive layer 25 and terminals 27. The IDT 22, the conductive layer 23 and the adhesive layer 25 are provided on a lower surface of the piezoelectric substrate 21. The conductive layer 23 includes terminals and interconnections connected to the IDT 22. A post electrode 26 is connected to the conductive layer 23. The via interconnections 24 pierce the piezoelectric substrate 21 in its thickness direction. Terminals 27 provided on an upper surface of the piezoelectric substrate 21 are electrically connected to the top surfaces of the via interconnections 24.

The receive filter 30 includes a piezoelectric substrate 31, an IDT 32, a conductive layer 33, via interconnections 34, an adhesive layer 35 and terminals 37. The IDT 32, the conductive layer 33 and the adhesive layer 35 are provided on an upper surface of the piezoelectric substrate 31. The conductive layer 33 includes terminals and interconnections connected to the IDT 32. A post electrode 36 is connected to the conductive layer 33. The via interconnections 34 pierce the piezoelectric substrate 31 in its thickness direction. The terminals 37 connected on the upper surface of the piezoelectric substrate 31 are electrically connected to lower surfaces of the via interconnections 34. The post electrode 26 and the post electrode 36 are joined together. The transmit filter 20 and the receive filter 30 are filters respectively including surface acoustic wave (SAW) resonators. Reflectors may be respectively provided at both sides of each of the IDTs 22 and 32.

In FIG. 2A, only a transmit terminal 27a and a receive terminal 27b out of the multiple terminals 27 are illustrated, and only via interconnections 24a and 24b out of the multiple via interconnections 24 are illustrated. Similarly, only a transmit terminal 23a and a receive terminal 23b included in the conductive layer 23 are illustrated. In FIG. 2A, only a ground terminal 37a out of the multiple terminals 37 and only a via interconnection 34a out of the multiple via interconnections 34 are illustrated. Similarly, only a receive terminal 33a and a ground terminal 33d included in the conductive layer 33 are illustrated.

As illustrated in FIG. 2A, the via interconnection 24a is connected to the transmit terminals 23a and 27a. The via interconnection 24b is connected to the receive terminals 23b and 27b and is further connected to the receive terminal 33a via the post electrodes 26 and 36. The via interconnection 34a is connected to the ground terminals 33d and 37a.

In FIG. 2B, there are illustrated only a ground terminal 27c out of the multiple terminals 27, only a via interconnection 24c out of the multiple via interconnections 24, and an antenna terminal 23c and a ground terminal 23d included in the conductive layer 23. In FIG. 2B, there are illustrated only an antenna terminal 37b out of the multiple terminals 37, a via interconnection 34b out of the multiple via interconnections 34, and an antenna terminal 33b and a ground terminal 33c included in the conductive layer 33.

As illustrated in FIG. 2B, the via interconnection 24c is connected to the ground terminals 23d and 27c and is further connected to the ground terminal 33c via the post electrodes 26 and 36. The via interconnection 34b is connected to the antenna terminals 33b and 37b, and is further connected to the antenna terminal 23c via the post electrodes 26 and 36.

Figure 3A:
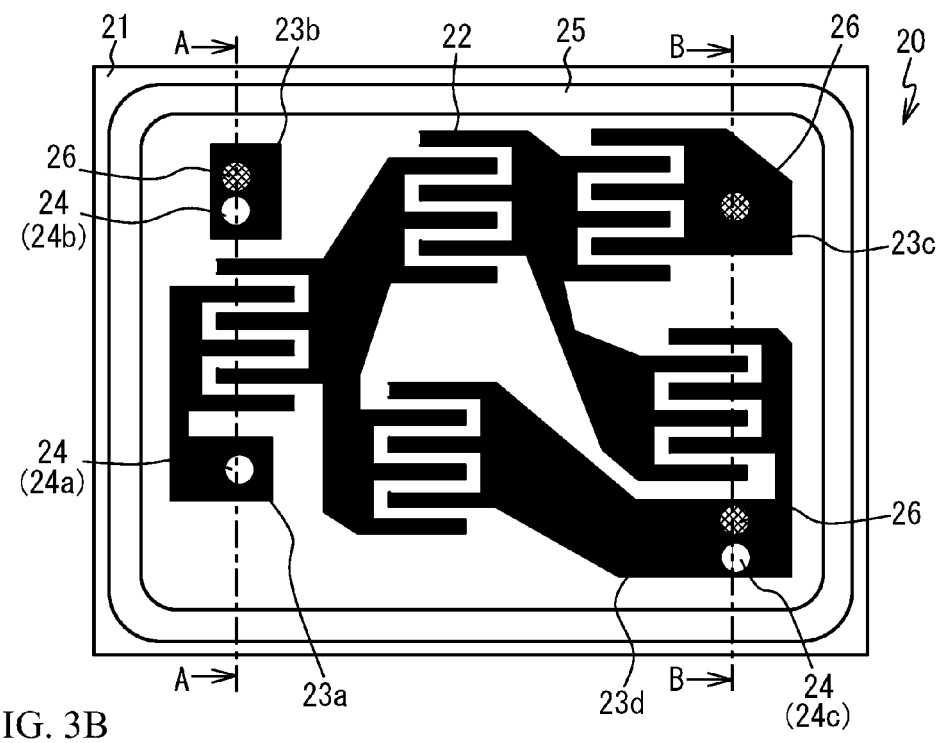
FIG. 3A is a plan view of a lower surface of a transmit filter chip.
Figure 3B:
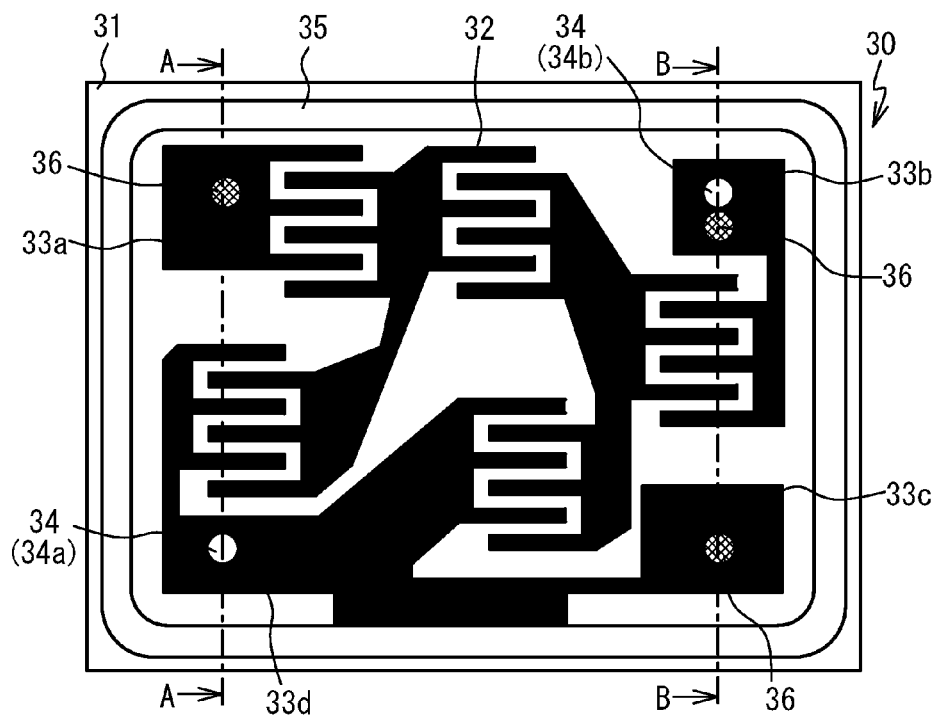
FIG. 3B is a plan view of an upper surface of a receive filter chip.

FIG. 3A is a plan view of an exemplary bottom surface of the transmit filter 20. In FIGS. 3A and 3B, the via interconnections 24 and 34 are depicted by outline circles on a black background, and the post electrodes 26 and 36 are depicted by outline circles with oblique grid lines. As illustrated in FIG. 3A, multiple IDTs 22 are arranged in a ladder form on the lower surface of the piezoelectric substrate 21. The via interconnection 24a is connected to the transmit terminal 23a. The via interconnection 24b and the post electrode 26 are connected to the receive terminals 23b. The post electrode 26 is connected to the antenna terminal 23c. The via interconnection 24c and the post electrode 26 are connected to the ground terminal 23d. The adhesive layer 25 surrounds the IDTs 22 and the conductive layer 23.

FIG. 3B is a plan view of a top surface of the receive filter 30. As illustrated in FIG. 3B, multiple IDTs 32 are arranged in a ladder form on the upper surface of the piezoelectric substrate 31. The post electrode 36 is connected to the receive terminal 33a and the ground terminal 33c. The via interconnection 34b and the post electrode 36 are connected to the antenna terminal 33b. The via interconnection 34a is connected to the ground terminal 33d. The adhesive layer 35 surrounds the IDTs 32 and the conductive layer 33.

As illustrated in FIG. 2A, the adhesive layers 25 and 35 are bonded together, and the piezoelectric substrates 21 and 31 are thus stacked together. A gap 11 is defined by the piezoelectric substrates 21 and 31 and the adhesive layers 25 and 35. The IDTs 22 and 32 are function parts that excite acoustic waves. Since the IDTs 22 and 32 are exposed to the gap 11, the excitation of the acoustic waves by the IDTs 22 and 32 is not prevented. The adhesive layers 25 and 35 are bonded together, whereby the IDTs 22 and 32 are hermetically sealed therewith in the gap 11. The use of the via interconnections 24 in the piezoelectric substrate 21 and the via interconnections 34 in the piezoelectric substrate 31 makes it possible to input and output signals through the terminals 27 and 37. The terminals 27 are provided on the upper surface of the duplexer 10 and the terminals 37 are provided on the lower surface thereof. Thus, in the first embodiment, the distances between the terminals 27 and 37 are larger than those in a comparative example having terminals provided on only a single surface of a duplexer, as will be described later.

The terminal 27a provided on the upper surface of the piezoelectric substrate 21 in FIG. 2A functions as the transmit terminal Tx illustrated in FIG. 1. The receive terminal 27b provided on the upper surface of the piezoelectric substrate 21 functions as the receive terminal Rx. The antenna terminal 37b provided on the lower surface of the piezoelectric substrate 31 in FIG. 2B functions as the antenna terminal ANT. The transmit terminal Tx and the receive terminal Rx are provided on the upper surface of the duplexer 10, and the antenna terminal ANT is provided on the lower surface thereof. It is thus possible to suppress interference between the input and output signals of the duplexer 10. Thus, the first embodiment is capable of hermetically sealing the IDTs 22 and 32 and suppressing deterioration of the electric characteristics of the duplexer 10.

The three terminals of the duplexer 10, that is, the transmit terminal Tx, the receive terminal Rx and the antenna terminal ANT are formed by using two terminals 27 and one terminal 37 or one terminal 27 and two terminals 37. That is, two of the terminals Tx, Rx and ANT are formed by two terminals 27 or 37, and the rest is formed by one terminal 37 or 27. It is thus possible to suppress deterioration of the electric characteristics of the duplexer 10. A module may be formed by using the duplexer 10.

Figure 4:
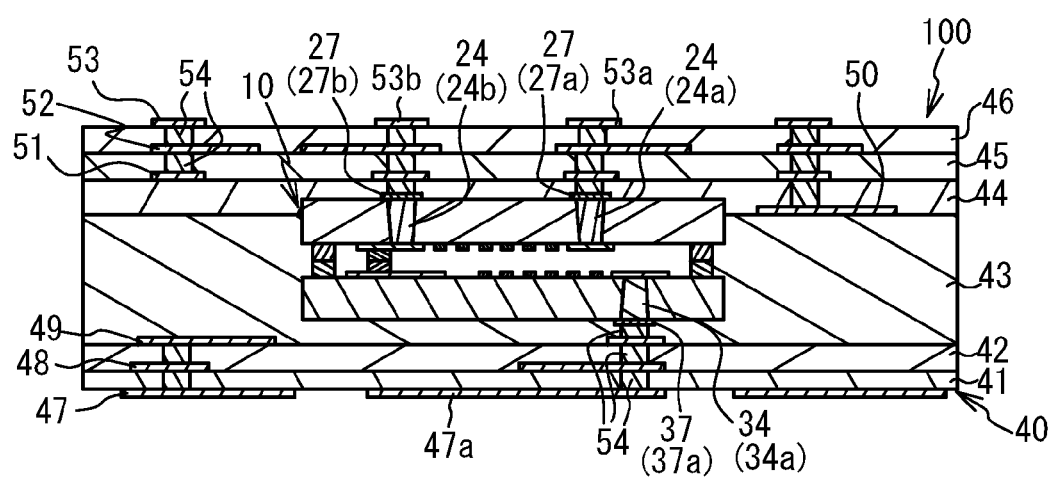
FIG. 4 is a cross-sectional view of an exemplary module.

FIG. 4 is a cross-sectional view of a module 100. The module 100 includes an interconnection substrate 40 and the duplexer 10. The interconnection substrate 40 is a multilayer substrate in which insulative layers 41 through 46 and conductive layers 47 through 53 are stacked alternately one by one. The duplexer 10 is buried in the insulative layers 43 and 44 of the interconnection substrate 40. The conductive layers are electrically interconnected by via interconnections 54 that pierce the insulative layers.

The conductive layer 47 is provided on a surface of the interconnection substrate 40 at the lower surface side of the duplexer 10 (that is, the lower surface of the interconnection substrate 40). A terminal 47a included in the conductive layer 47 is connected to the ground terminal 37a of the duplexer 10 via the conductive layers 48 and 49 and the via interconnection 54. The conductive layer 53 is provided on a surface of the interconnection substrate 40 at the upper side of the duplexer 10 (that is, the upper surface of the interconnection substrate 40). A terminal 53a included in the conductive layer 53 is connected to the signal terminal 27a via the conductive layers 51 and 52 and the via interconnection 54. A terminal 53b included in the conductive layer 53 is connected to the receive terminal 27b via the conductive layers 51 and 52 and the via interconnection 54. The antenna terminal 37b illustrated in FIG. 2B is connected to a terminal included in the conductive layer 47 via the conductive layers 48 and 49 and the via interconnection 54. The ground terminal 27c is connected to a terminal included in the conductive layer 53 via the conductive layers 51 and 52 and the via interconnection 54.

That is, the terminals 27 on the upper surface of the duplexer 10 are connected to the terminals on the upper surface of the interconnection substrate 40. The terminals 37 on the lower surface of the duplexer 10 are connected to the terminals on the lower surface of the interconnection substrate 40. It is thus possible to suppress interference between signals and suppress deterioration of the electric characteristics of the module 100.

The interconnections that interconnect the terminals of the duplexer 10 and those of the interconnection substrate 40 do not bypass the duplexer 10. It is thus possible to improve the design flexibility. Circuits for bypassing are not needed, and accordingly, the area of the interconnection substrate 40 may be reduced and the module 100 may be downsized. An area for bypass circuits conventionally needed may be used for arranging interconnections. It is possible to reduce the lengths of the interconnections between the terminals. The reduced lengths of the interconnections reduce signal insertion loss and makes it easy to set the impedance values of the interconnections to desired values. The interconnections between the terminals include interconnections included in the conductive layers and the via interconnections 54.

It is preferable that the interconnection line that interconnects the transmit terminal 27a and the terminal 53a and the interconnection line that interconnects the receive terminal 27b and the terminal 53b are provided between the upper surface of the duplexer 10 and the upper surface of the interconnection substrate 40 and is not provided on the layers that face the side surfaces of the duplexer 10 as well as the layer that are lower than the side surfaces. It is preferable that the interconnection line that interconnects the ground terminal 37a and the terminal 47a is provided between the lower surface of the duplexer 10 and the lower surface of the interconnection substrate 40 and is not provided on the layers that face the side surfaces of the duplexer 10 as well as the layers that are higher than the upper surface thereof. The above preferable interconnections have reduced lengths.

The insulative layers 41 through 46 are made of an insulative substance, which may be resin such as glass epoxy resin or ceramic. The conductive layers 23, 33 and 47 through 53, the adhesive layers 25 and 35, the post electrodes 26 and 36, the terminals 27 and 37 and the via interconnections 24, 34 and 54 may be made of a metal such as copper (Cu) and gold (Au). The adhesive layers may be formed of resin or brazing filler, and may be a single layer or a multilayer composed of two or three layers. The piezoelectric substrates 21 and 31 may be formed by a piezoelectric substance such as lithium niobate ($LiNbO_3$) and lithium tantalate ($LiTaO_3$). Since the piezoelectric substrates 21 and 31 are flat plates, and the gap 11 is formed by bonding them by the adhesive layers 25 and 35. The IDTs 22 and 32 may be made of a metal such as aluminum (Al).

The piezoelectric substrates 21 and 31 have almost the same thermal expansion coefficients. By bonding the two piezoelectric substrate 21 and 31 together, it is possible to suppress stress resulting from temperature change. A substrate made of, for example, sapphire, may be bonded above the piezoelectric substrate 21 and below the piezoelectric substrate 31. Sapphire has a relatively small thermal expansion coefficient and a relatively small Young's ratio, and is capable of suppressing expansion of the piezoelectric substrates.

A description is now be given of a method for fabricating the duplexer 10. FIGS. 5A through 7B are cross-sectional views that illustrate an exemplary method for fabricating the duplexer 10. Referring to FIG. 5A, a laser beam is projected onto the piezoelectric substrate 31 to form through holes 38. Referring to FIG. 5B, the via interconnections 34 are formed in the through holes 38 by plating. Referring to FIG. 5C, the IDTs 32 and the conductive layer 33 are formed on one of the opposite surfaces of the piezoelectric substrate 31 (first surface), and the terminals 37 are formed on the other surface (second surface) by evaporation and liftoff. Referring to FIG. 5D, a resist 39 is formed on the first surface of the piezoelectric substrate 31 and is then patterned. By this patterning, parts of the conductive layer 33 are exposed from the openings of the resist 39. Referring to FIG. 5E, a seed metal 39a is formed on the surface of the resist 39. By electrolytic plating with the seed metal 39a being as an electricity feed line, the adhesive layer 35 and the post electrodes 36 are formed.

Figure 7A:
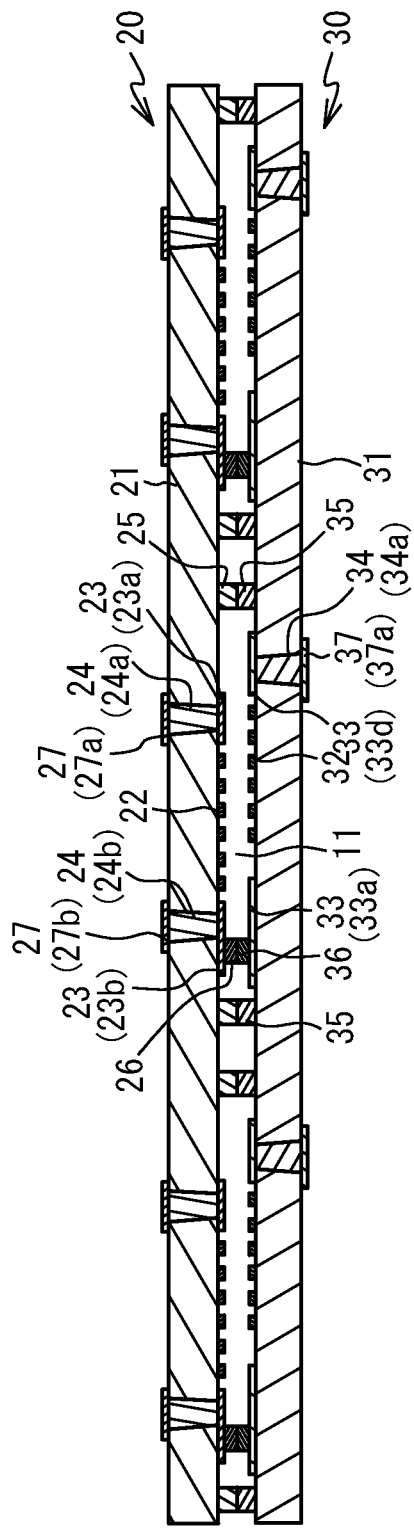
FIGS. 7A and 7B are cross-sectional views of steps that follow those of FIGS. 6A through 6C.
Figure 7B:
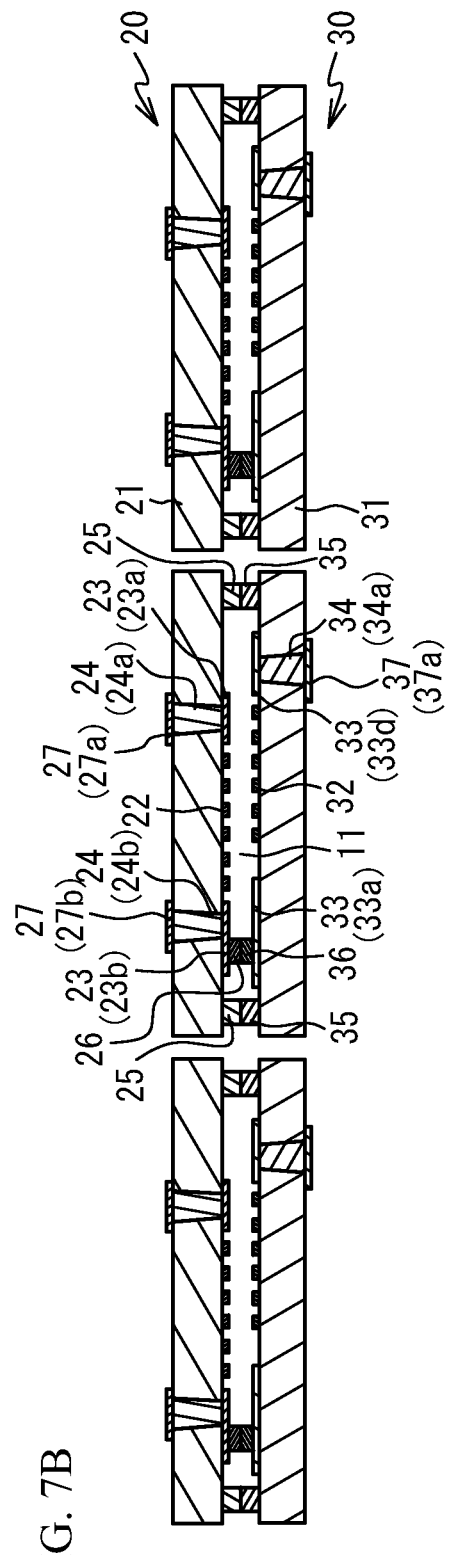

Referring to FIG. 6A, the adhesive layer 35 and the post electrodes 36 are treated to have a desired height by CMP (Chemical Mechanical Polishing). Referring to FIG. 6B, the resist 39 and the seed metal 39a are removed. The receive filter 30 is formed through the above steps. The transmit filter 20 may be formed by steps similar to those described above. As illustrated in FIGS. 6C and 7A, the adhesive layer 25 and the adhesive layer 35 are bonded together and the post electrodes 26 and the post electrode 36 are bonded together by Au—Au bonding, for example. Thus, the piezoelectric substrates 21 and 31 are stacked together. Referring to FIG. 7B, individual duplexers 10 are available by dicing.

Figure 8A:
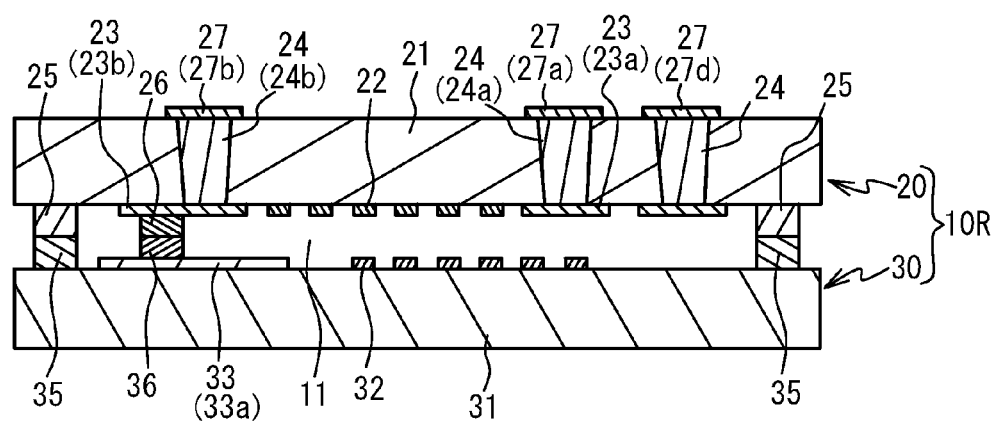
FIG. 8A is a cross-sectional view of an exemplary duplexer in accordance with a comparative example.

A comparative example is now described. FIG. 8A is a cross-sectional view of a duplexer 10R of a comparative example. Referring to FIG. 8A, the via interconnections 34 are not provided in the piezoelectric substrate 31. The transmit terminal 27a, the receive terminal 27b and the antenna terminal 27d are provided on the upper surface of the piezoelectric substrate 21. That is, the transmit terminal Tx, the receive terminal Rx and the antenna terminal ANT illustrated in FIG. 1 are provided on the upper surface of the duplexer 10R. Thus, interference between signals occurs and the electric characteristics of the duplexer 10a deteriorate.

Figure 8B:
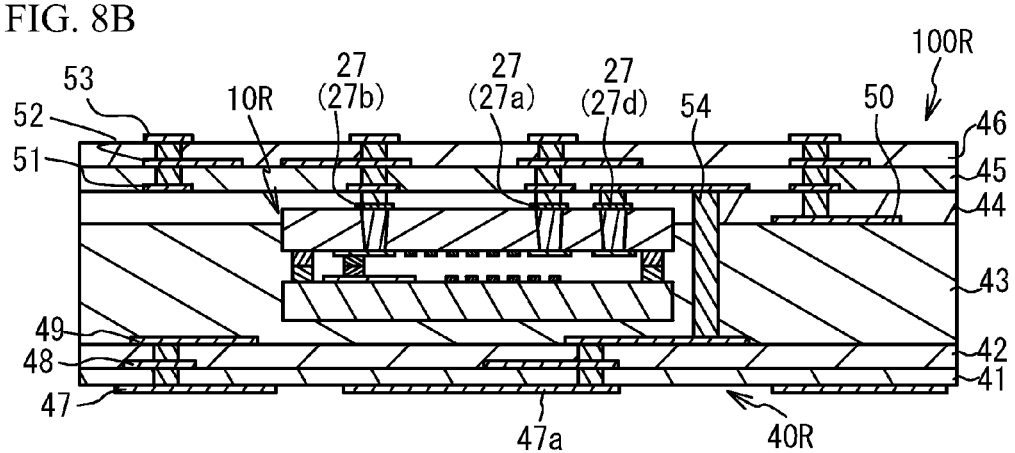
FIG. 8B is a cross-sectional view of a module that includes the duplexer.

FIG. 8B is a cross-sectional view of a module 100R with the duplexer 10R. Referring to FIG. 8B, an interconnection that interconnects the antenna terminal 27d of the duplexer 10 and the terminal 47a provided on the lower surface of the interconnection substrate 40 is provided so as to bypass the duplexer 10R. This arrangement of the interconnection decreases the design flexibility and makes it difficult to downsize the module 100R. Further, the interconnection between the terminals is larger than that in the first embodiment. This increases loss of signal and leads to a difficulty in setting the impedance of the interconnection to a desired value.

Figure 9A:
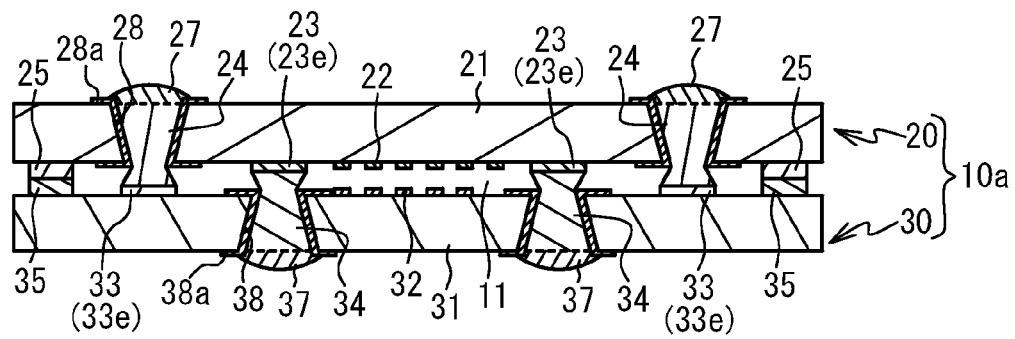
FIG. 9A is a cross-sectional view of a duplexer in accordance with a variation.

A description is now given of a variation of the first embodiment. FIG. 9A is a cross-sectional view of a duplexer 10a in accordance with a variation of the first embodiment. Referring to FIG. 9A, there are metal layers 28a, each of which is provided on a part of the upper surface of the piezoelectric substrate 21 that surrounds the corresponding through hole 28, the inner wall of the through hole 28 of concern, and a part of the lower surface thereof that surrounds the through hole 28 of concern. The through holes 28 are full of the via interconnections 24, which extend up to the upper surface of the piezoelectric substrate 31. The two via interconnections 24 illustrated in FIG. 9A are electrically connected to terminals 33e included in the conductive layer 33, respectively. The terminals 27 are provided on the upper surfaces of the via interconnections 24. The IDT 32 is electrically connected to the terminal 27 via the terminals 33e and the via interconnections 24.

There are metal layers 38a, each of which is provided on a part of the upper surface of the piezoelectric substrate 31 that surrounds the corresponding through hole 38, the inner wall of the through hole 38 of concern, and a part of the lower surface of the piezoelectric substrate 31 that surrounds the through hole 38 of concern. The through holes 38 are full of the via interconnections 34, which extend up to the lower surface of the piezoelectric substrate 21. The two via interconnections 34 are electrically connected to the terminals 23e included in the conductive layer 23, respectively. The terminals 37 are provided on the upper surfaces of the via interconnections 34. The IDT 22 is electrically connected to the terminals 37 via the terminals 23e and the via interconnections 34.

The via interconnections 24 and 34 and the terminals 27 and 37 may be made of a metal such as solder including tin and silver (Sn—Ag), for example. In FIG. 9A, although the via interconnections 24 and the terminals 27 are separated from each other by dotted lines, the via interconnections 24 and the terminals 27 are integrally formed. Parts of the integrally formed members that protrude from the upper surface of the piezoelectric substrate 21 function as the terminals 27. The via interconnections 34 and the terminals 37 are integrally formed members, and parts thereof that protrude from the upper surface of the piezoelectric substrate 31 function as the terminals 37.

The transmit filter 20 inputs and outputs signals from and to an outside of the transmit filter 20 through the via interconnections 34 and the terminals 37. The receive filter 30 inputs and outputs signal from and to an outside of the receive filter 30 through the via interconnections 24 and the terminals 27. The multiple terminals 37 include the transmit terminal Tx illustrated in FIG. 1, and the multiple terminals 27 include the receive terminal Rx in FIG. 1. The transmit terminal Tx is located on the lower surface of the duplexer 10 and the receive terminal Rx is located on the upper surface of the duplexer 10. Thus, large distances between the terminals are available. It is thus possible to suppress interference between the transmit signal and the receive signal, and suppress deterioration of the electric characteristics of the duplexer 10a. The duplexer 10a may be buried in the interconnection substrate 40.

Figure 9B:
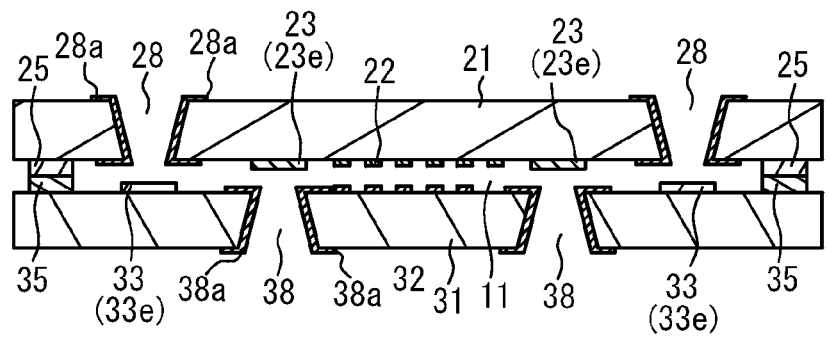
FIGS. 9B and 9C are cross-sectional views that illustrate an exemplary method for fabricating the duplexer.
Figure 9C:
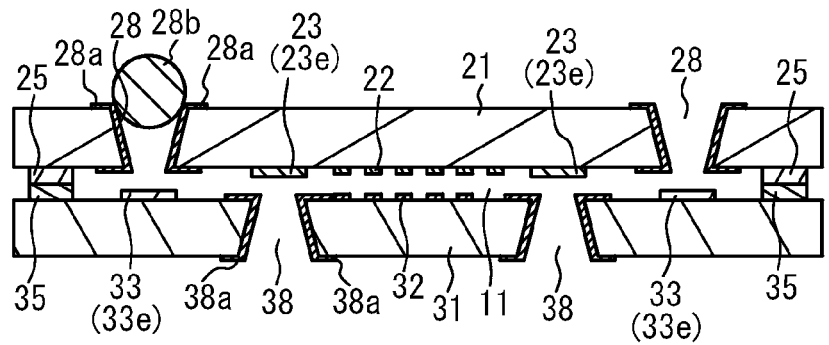

FIGS. 9B and 9C are cross-sectional views that illustrate a method for fabricating the duplexer. Referring to FIG. 9B, the adhesive layers 25 and 35 are bonded together, and the piezoelectric substrates 21 and 31 are thus stacked together. The through holes 28 and the metal layers 28a are formed in the piezoelectric substrate 21, and the through holes 38 and the metal layers 38a are formed in the piezoelectric substrate 31. Referring to FIG. 9C, a solder ball 28b is arranged in the through holes 28, and laser reflow is performed. The solder ball 28b is melted by laser and expands to the corresponding metal layer 28a with wettability, whereby the via interconnection 24 with which the through hole 28 is filled and the terminal 27 which protrudes from the upper surface of the piezoelectric substrate 21 are formed from the solder ball 28b. Since the via interconnections 24 and the terminals 27 are integrally formed and are made of solder, a simple step may be used to form the produce the via interconnections 24 and the terminals 27. A similar process may be used to form the via interconnections 34 and the terminals 37 from solder balls. Although only one piezoelectric substrate 21 and only one piezoelectric substrate 31 are illustrated in FIGS. 9B and 9C, a wafer having multiple piezoelectric substrates 21 and a wafer having multiple piezoelectric substrates 31 may be used in the above process, as in the case of FIG. 5A.

Second Embodiment

Figure 10A:
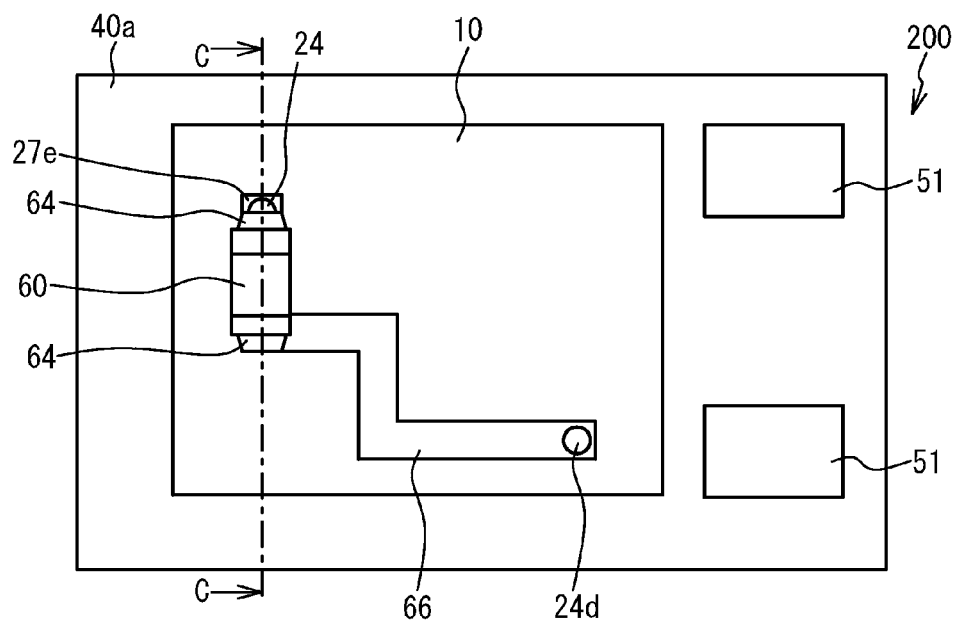
FIG. 10A is a plan view of a module in accordance with a second embodiment.
Figure 10B:
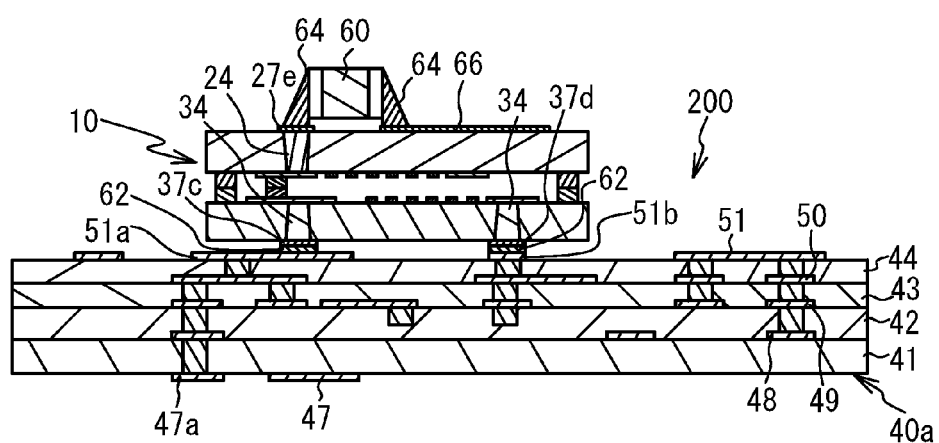
FIG. 10B is a cross-sectional view of the module.

FIG. 10A is a plan view of an exemplary module 200 in accordance with a second embodiment. FIG. 10B is a cross-sectional view taken along a line C-C in FIG. 10A. A description of structures of the second embodiment that are similar to those of the first embodiment is omitted.

As illustrated in FIG. 10B, an interconnection substrate 40a includes insulative layers 41 through 44 and conductive layers 47 through 51, which are stacked alternately one by one. As illustrated in FIGS. 10A and 10B, the duplexer 10 is flip-chip mounted on the upper surface of the interconnection substrate 40a. A chip component 60 is mounted on the upper surface of the duplexer 10.

As illustrated in FIG. 10B, a receive terminal 37c of the duplexer 10 is electrically connected to a terminal 51a included in the conductive layer 51 through a bump 62. A ground terminal 37d is connected to a terminal 51b included in the conductive layer 51 through another bump 62. The chip component 60 is connected, via solders 64, to a receive terminal 27e and an interconnection 66 provided on the upper surface of the duplexer 10. As illustrated in FIG. 10A, the interconnection 66 is connected to a via interconnection 24d.

Since the receive terminal 27e is provided on the upper surface of the duplexer 10, it is possible to mount the chip component 60 on the upper surface of the duplexer 10. Since the receive terminal 37c and the ground terminal 37d are provided on the lower surface of the duplexer 10, it is possible to flip-chip mount the duplexer 10 on the upper surface of the interconnection substrate 40. According to the second embodiment, downsizing and integration of the module 200 are achieved.

The chip component 60 includes a passive component such as an inductor and a capacitor, and is involved in impedance matching between the antenna and the duplexer 10. Besides the passive component, an active component such as an IC including a power amplifier and a low-noise amplifier and a switch. Multiple chip components may be mounted on the duplexer 10.

The present invention is not limited to the specific embodiments described above but may include other embodiments and variations within the scope of the claimed invention. The acoustic wave device is not limited to the SAW device but may be a device that includes an acoustic boundary wave device or a film bulk acoustic resonator (FBAR).

Figure 11A:
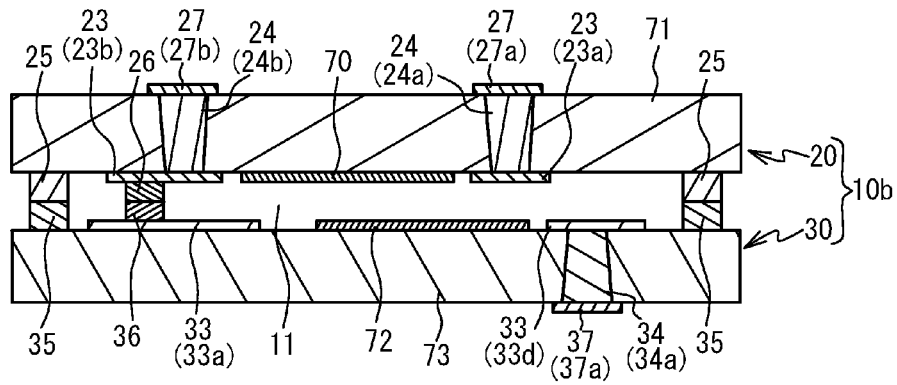
FIGS. 11A and 11B are cross-sectional views of a duplexer including an FBAR.
Figure 11B:
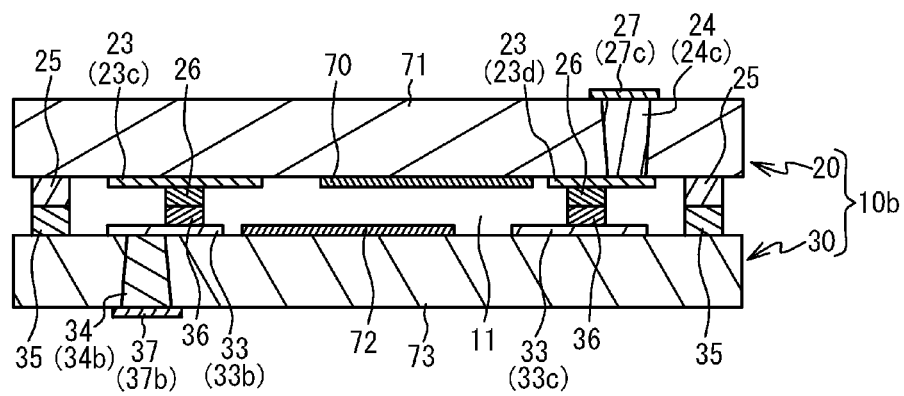
Figure 11C:
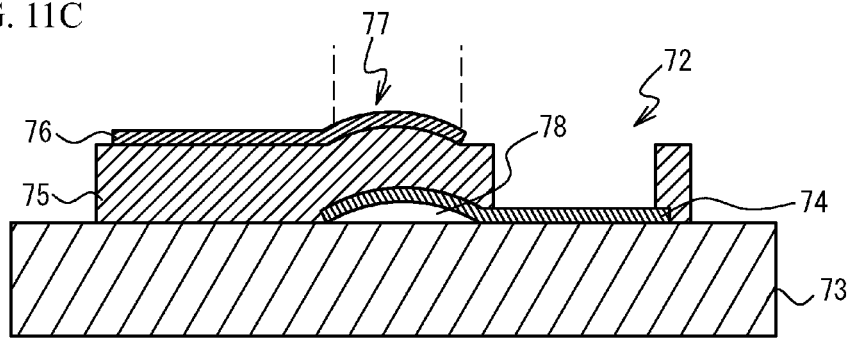
FIG. 11C is an enlarged cross-sectional view of an FBAR.
Figure 12A:
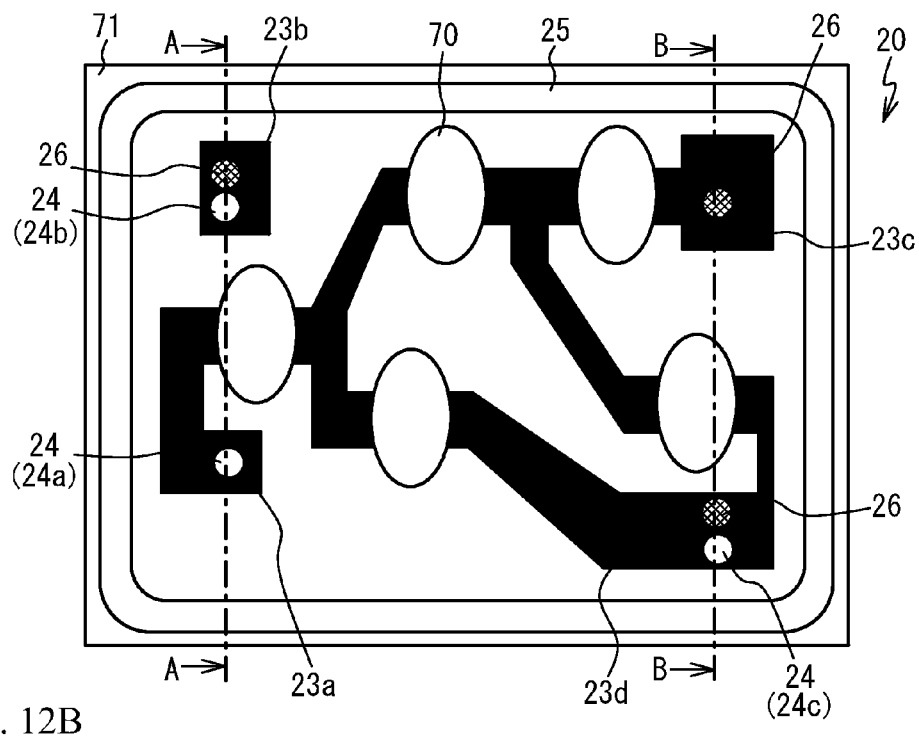
FIG. 12A is a plan view of a transmit filter chip.
Figure 12B:
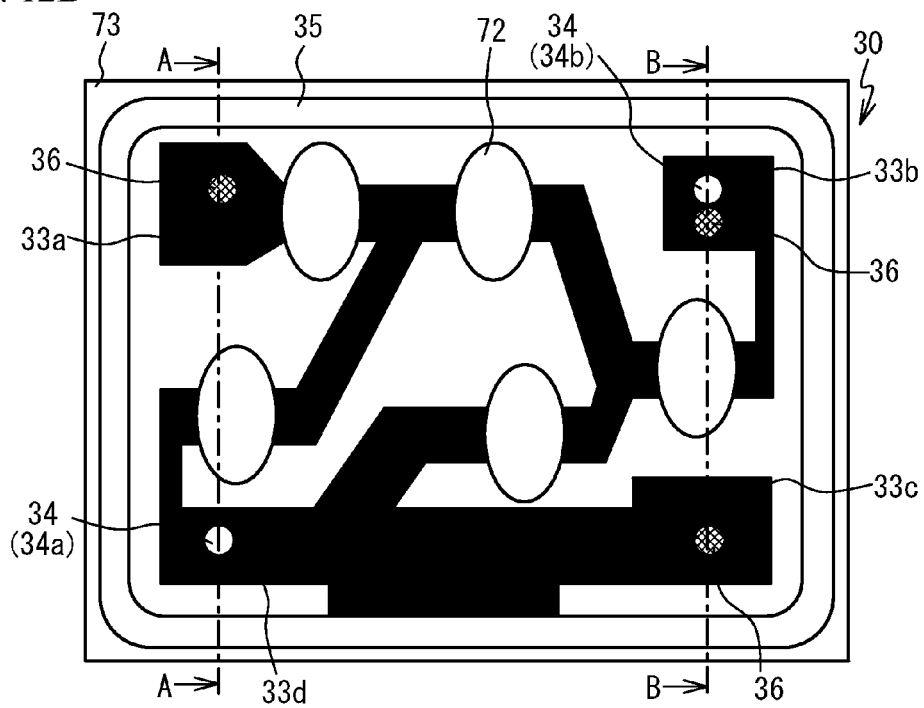
FIG. 12B is a plan view of a receive filter chip.

FIGS. 11A and 11B are cross-sectional views of a duplexer 10b that includes FBARs 70 and 72. FIG. 11C is an enlarged cross-sectional view of the FBAR 72. FIG. 12A is a plan view of an exemplary structure of the transmit filter 20, and FIG. 12B is a plan view of an exemplary structure of the receive filter 30. A description of structures that are similar to those previously described is omitted.

Referring to FIGS. 11A and 11B, the FBARs 70 are provided on a lower surface of a substrate 71 of the transmit filter 20. The FBARs 72 are provided on an upper surface of a substrate 73 of the receive filter 30. As illustrated in FIG. 12A, the FBARs 70 are arranged in a ladder form. As illustrated in FIG. 12B, the FBARs 72 are arranged in a ladder form.

As illustrated in FIG. 11C, a lower electrode 74, a piezoelectric thin film 75 and an upper electrode 76 are stacked on the substrate 73. Acoustic waves are excited in a resonance section 77 in which the lower electrode 74, the piezoelectric thin film 75 and the upper electrode 76 overlap with each other. The resonance section 77 is raised upwards in a dome shape, and a gap 78 is formed between the lower electrode 74 and the substrate 73. The resonance section 77 is exposed to the gap 11 illustrated in FIGS. 11A and 11B. Excitation of the acoustic waves is not prevented due to the presence of the gaps 11 and 78. The lower electrode 74 may be exposed to the gap 78, and an acoustic reflection film may be attached to the lower surface of the lower electrode 74.

The substrate 73 may be made of silicon (Si) or glass, for example. It is preferable that the silicon substrate is made of silicon that has an electric resistance as high as 1 k$\Omega$·cm or higher. This is intended to suppress leakage of signal from the via interconnections 24 and 34 to the substrate. If the substrate is made of silicon having a low electric resistance, it is preferable a member having a high resistance such as an insulative film is interposed between the via interconnections and the substrates. The lower electrodes 74 and the upper electrodes 76 may be made of a metal such as ruthenium (Ru). The piezoelectric thin film 75 may be made of a piezoelectric substrate such as aluminum nitride (AlN), zinc oxide (ZnO), lead zirconate titanate (PZT), and lead zirconate titanate (PbTiO$_3$). The FBAR 70 has a structure similar to that of the FBAR 72. The duplexer 10*b* may be mounted on a module.

In the first and second embodiments, the function parts of the transmit filter 20 (IDT or the resonance section of FBAR) and the function parts of the receive filter 30 are connected to both of the via interconnections 24 and 34. The function parts may be connected to at least either the via interconnections 24 or 34. For example, the function parts of the transmit filter 20 are connected to the via interconnections 24 and are not connected to the via interconnections 34. Similarly, the function parts of the receive filter 30 are connected to the via interconnections 34 and are not connected to the via interconnections 24. As in the case illustrated in FIG. 9A, an arrangement may be employed in which the function parts of the transmit filter 20 are connected to the via interconnections 34 and not to the via interconnections 24, and the function parts of the receive filter 30 are connected to the via interconnections 24 and not to the via interconnections 34.

Figure 13A:
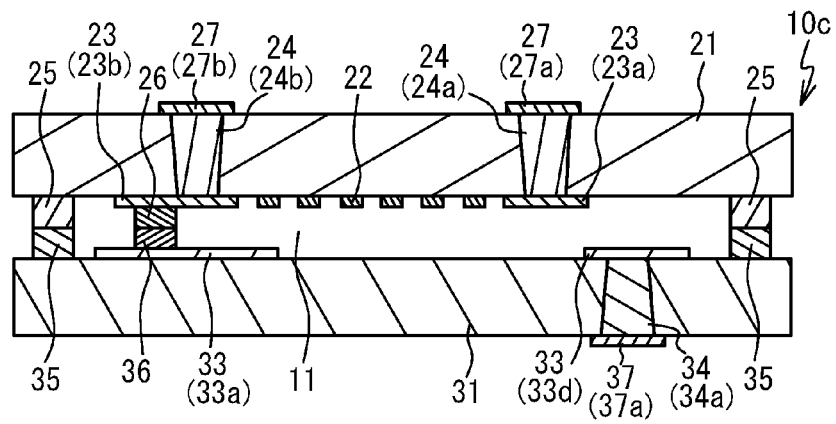
FIG. 13A is a cross-sectional view of an exemplary electronic component.

The function parts may be provided on either one of the substrates. FIG. 13A is a cross-sectional view of an exemplary electronic device 10*c*. Referring to FIG. 13A, the IDT 22 is provided on the piezoelectric substrate 21, and the IDT 32 is not provided on the piezoelectric substrate 31. The electronic device 10*c* functions as an acoustic wave filter. The IDTs 22 may be hermetically sealed. Either the terminals 27 or the terminals 37 function as input terminals and the other function as output terminals. Since the distance between the input and output terminals is increased, interference between signals is suppressed and deterioration of the electric characteristics is suppressed. Instead of the piezoelectric substrate 31, a sapphire substrate may be bonded to the piezoelectric substrate 21. A sapphire substrate may be attached on the piezoelectric substrate 21, and another sapphire substrate may bonded instead of the piezoelectric substrate 31. Since the piezoelectric substrate 21 is sandwiched between the sapphire substrates, it is possible to effectively suppress expansion of the piezoelectric substrate 21. In this manner, the function parts may be provided on at least one of the two substrates.

In addition to acoustic wave elements such as IDT and resonance section, the function parts may include passive elements such as an inductor, capacitor and resistor. It is possible to provide an integrated passive device (IPD) in which the passive elements are hermetically sealed with the two substrates. The distance between the input and output terminals is increased, so that interference between signals can be suppressed and deterioration of the electric characteristics can be suppressed.

Figure 13B:
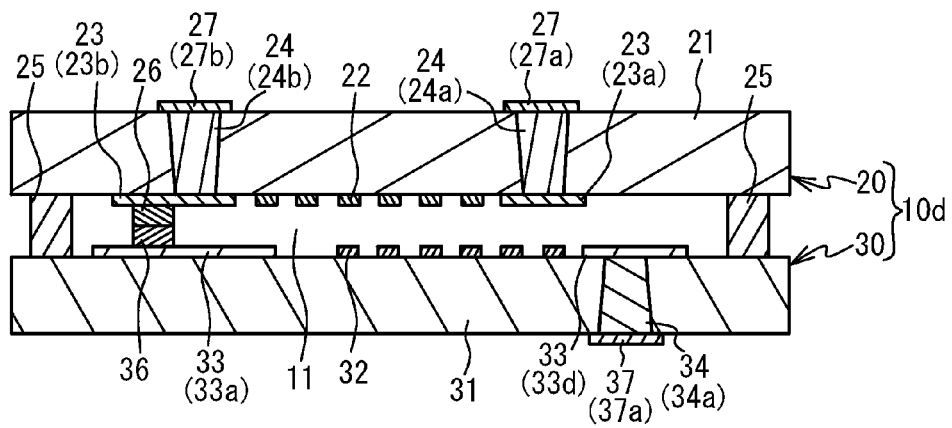
FIG. 13B is a cross-sectional view of a duplexer that includes a single adhesive layer.

In the first and second embodiments, the two piezoelectric substrates 21 and 31 are stacked together by bonding the two adhesive layers 25 and 35. Only one adhesive layer may be used. FIG. 13B is a cross-sectional view of an exemplary duplexer 10*d*, which includes only one adhesive layer 25. Referring to FIG. 13B, the piezoelectric substrates 21 and 31 are stacked together with an adhesive layer 25. The adhesive layer 25 may be made of a metal or resin. The adhesive layer 25 is attached to either the piezoelectric substrate 21 or 31, and is bonded to the other in the step illustrated in FIG. 6C.

Figure 13C:
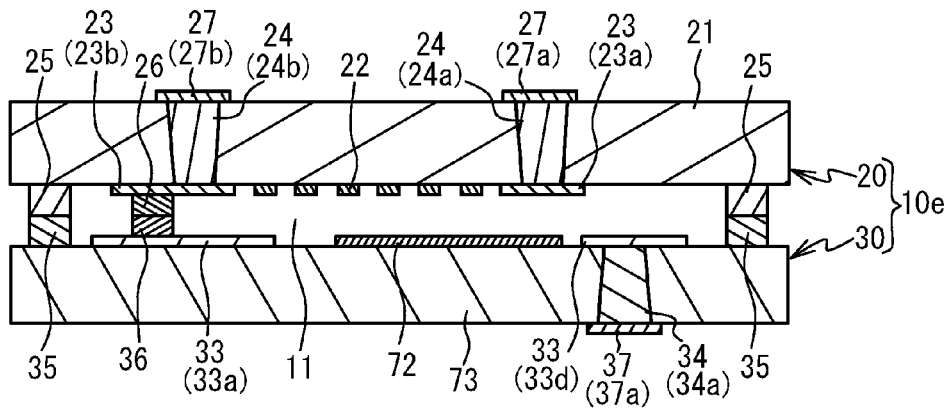
FIG. 13C is a cross-sectional view of a duplexer that includes a SAW resonator and an FBAR.

It is possible to use both the SAW resonator and the FBAR. FIG. 13C is a cross-sectional view of an exemplary duplexer 10*e*, which includes a SAW resonator and an FBAR. The transmit filter 20 includes SAW resonators, and the receive filter includes FBARs 72. The IDTs 22 and the resonance sections 77 of FBARs 72 (see FIG. 11C) are exposed to the gap 11. One of the transmit filter 20 and the receive filter 30 may include SAW resonators, and the other includes FBARs. The electronic device 10*c* in FIG. 13A, the duplexer 10*d* in FIG. 13B or the duplexer 10*e* in FIG. 13C may be mounted on a module.

Third Embodiment

Figure 14A:
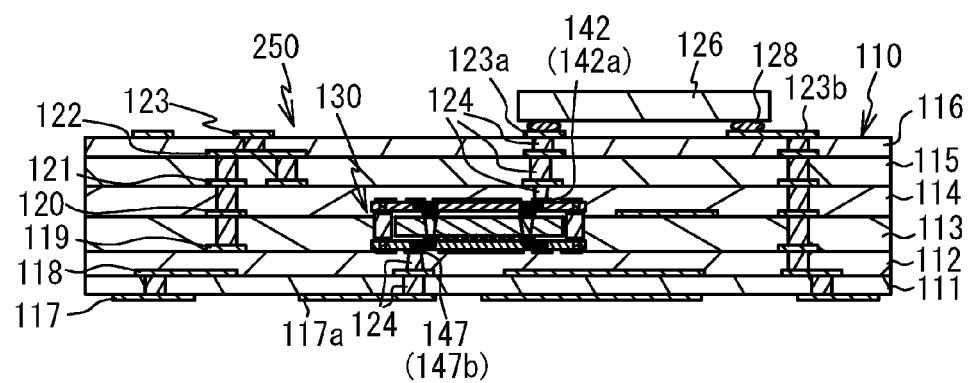
FIG. 14A is a cross-sectional view of an exemplary module in accordance with a third embodiment.
Figure 14B:
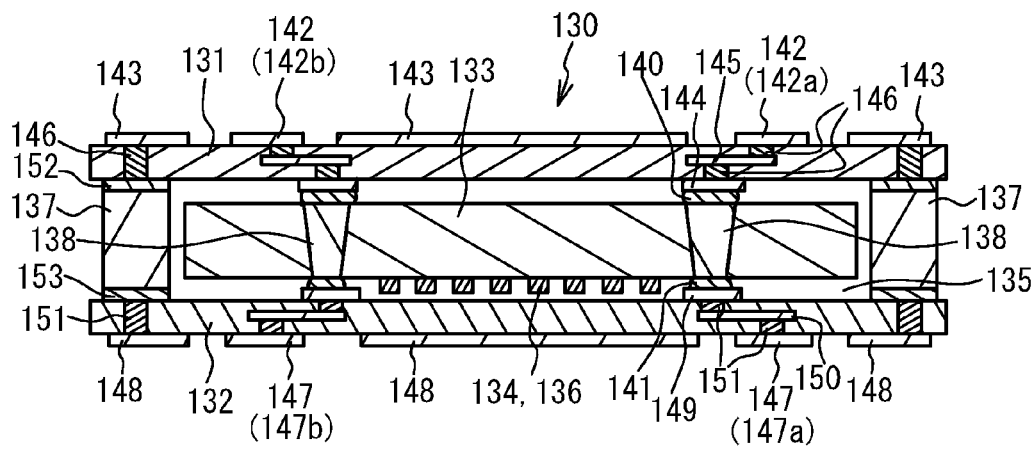
FIG. 14B is a cross-sectional view of an exemplary acoustic wave device.
Figure 15A:
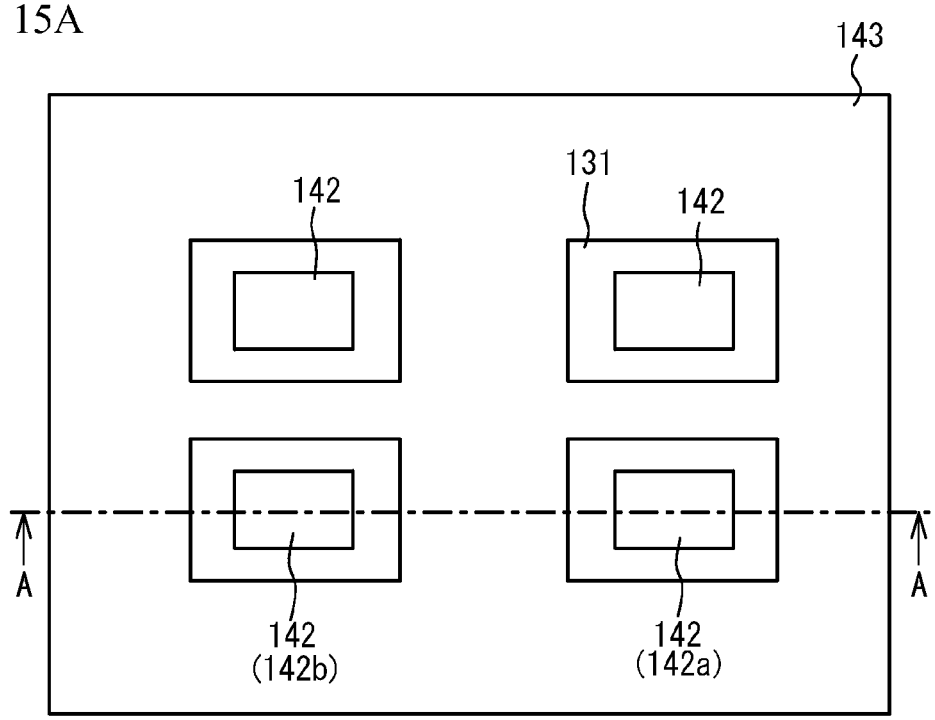
FIG. 15A is a top view of an exemplary acoustic wave device.
Figure 15B:
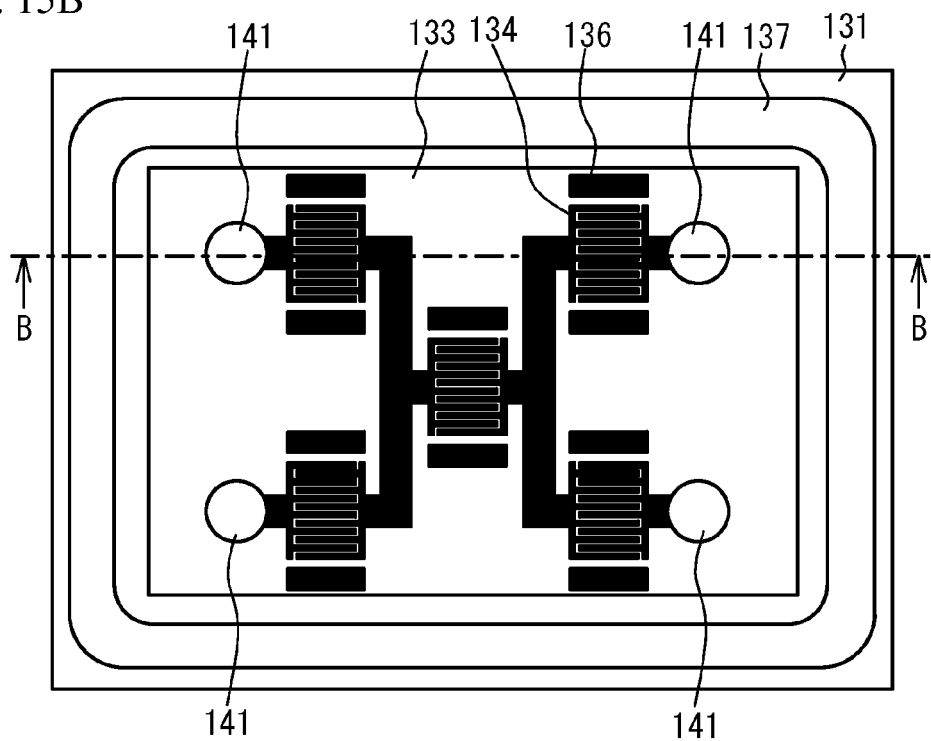
FIG. 15B is a bottom view of an exemplary acoustic wave device seen through a package substrate.

FIG. 14A is a cross-sectional view of an exemplary module 250 in accordance with a third embodiment. FIG. 14B is a cross-sectional view of an exemplary acoustic wave device 130. FIG. 15A is a top view of the acoustic wave device 130. FIG. 15B is a bottom view of the acoustic wave device 130 seen through a package substrate 132. FIG. 14B is a cross-sectional view taken along a line A-A in FIG. 15A, and along a line B-B in FIG. 15B.

As illustrated in FIG. 14A, the module 250 is provided with an interconnection substrate 110, a power amplifier (PA) 126, and the acoustic wave device 130. The acoustic wave device 130 is buried in the interconnection substrate 110. The acoustic wave device 130 is, for example, a SAW filter that functions as a transmit filter. The PA 126 is mounted on an upper surface of the interconnection substrate 110. The PA 126 amplifies a transmit signal, and the acoustic wave device 130 filters the transmit signal. The filtered transmit signal is transmitted through an antenna that is not illustrated. The transmit signal is, for example, an RF signal having frequencies in the band of W-CDMA.

The interconnection substrate 110 is a multilayered substrate in which insulative layers 111 through 116 and conductive layers 117 through 123 are stacked alternately one by one. Electric connections between the conductive layers are made by via interconnections 124 that pierce the insulative layers. The acoustic wave device 130 is buried in the insulative layers 113 and 114. Terminals 123*a* and 123*b* included in the conductive layer 123 are connected to the PA 126.

As illustrated in FIG. 14B, the acoustic wave device 130 includes a package substrates 131 and 132, and a piezoelectric substrate 133. The package substrate 131 is mounted above the piezoelectric substrate 133, and the package substrate 132 is arranged below the piezoelectric substrate 133. The package substrates 131 and 132 are bonded together by a seal ring 137. As illustrated in FIGS. 14B and 15B, IDTs 134 (function parts) and reflectors 136 are provided on a lower surface of the piezoelectric substrate 133. A gap 135 is formed between the piezoelectric substrate 133 and the package substrate 131, and another gap 135 is formed between the piezoelectric substrate 133 and the package substrate 132. Thus, excitation of acoustic waves by the IDTs 134 are not prevented.

As illustrated in FIG. 14B, the piezoelectric substrate 133 is provided with via interconnections 138, which pierce the piezoelectric substrate 133. One end of each of the via interconnection 138 is exposed from the upper surface of the piezoelectric substrate 133, and the other end is exposed from the lower surface of the piezoelectric substrate 133. Bumps 140 are connected to the ends of the via interconnections 138 exposed from the upper surface of the piezoelectric substrate 133. Bumps 141 are connected to the ends of the via interconnections 138 exposed from the lower surface of the piezoelectric substrate 133. As illustrated in FIG. 15B, the IDTs 134 are connected to the bumps 141, and are connected to the bumps 140 through the via interconnections 138.

As illustrated in FIG. 15A, four terminals 142 and a ground layer 143 are provided on the upper surface of the package substrate 131 (the upper surface of the acoustic wave device 130). As illustrated in FIG. 14B, conductive layers 144 and 152 are provided on the lower surface of the package substrate 131, and a conductive layer 145 and via interconnections 146 are provided within the package substrate 131. Further, four terminals 147 and a ground layer 148 are provided on the lower surface of the package substrate 132 (the lower surface of the acoustic wave device 130). Conductive layers 149 and 153 are provided on the upper surface of the package substrate 132, and a conductive layer 150 and via interconnections 151 are provided within the package substrate 132. In FIG. 14B, only terminals 142a and 142b out of the four terminals 142 are illustrated, and only terminals 147a and 147b out of the four terminals 147 are illustrated.

The bumps 140 provided on the upper surface of the piezoelectric substrate 133 are connected to the terminals 142 on the upper surface of the package substrate 131 through the conductive layers 144 and 145 and the via interconnections 146 in the package substrate 131. The bumps 141 are connected to the terminals 147 on the lower surface of the package substrate 132 through the conductive layers 149 and 150 of the package substrate 132 and the via interconnections 151. The terminal 142a is connected to the terminal 147a via the corresponding via interconnection 138 in the piezoelectric substrate 133, and the terminal 142b is connected to the terminal 147b via the corresponding via interconnection 138.

As illustrated in FIG. 14A, the terminal 142a is connected to the terminal 123a included in the conductive layer 123 through interconnections included in the conductive layers 121 and 122 and the via interconnections 124. The terminal 147b is connected to the terminal 117a included in the conductive layer 117 through an interconnection included in the conductive layer 118 and the via interconnection 124.

That is, the terminals 142 on the upper surface of the acoustic wave device 130 are connected to the terminals on the upper surface of the interconnection substrate 110. The terminals 147 on the lower surface of the acoustic wave device 130 are connected to the terminals on the lower surface of the interconnection substrate 110. Since the interconnections do not bypass the acoustic wave device 130, the flexibility of design of the module 250 is improved. Circuits for bypassing are not needed, and accordingly, the area of the interconnection substrate 110 may be reduced and the module 250 may be downsized. An area for bypass circuits conventionally needed may be used for arranging interconnections. It is possible to reduce the lengths of the interconnections between the terminals. The reduced lengths of the interconnections reduce signal insertion loss and makes it easy to set the impedance values of the interconnections to desired values. The interconnections between the terminals include interconnections included in the conductive layers and the via interconnections 124.

It is preferable that the interconnections that interconnect the terminals 142 and the terminals included in the conductive layer 123 are provided between the upper surface of the acoustic wave device 130 and the upper surface of the interconnection substrate 110, and are not provided on the layers of the interconnection substrate 110 that face the side surfaces of the acoustic wave device 130 as well as the layers thereof that are lower than the lower surface thereof. It is preferable that the interconnections that interconnect the terminals 147 and the terminals included in the conductive layer 117 are provided between the lower surface of the acoustic wave device 130 and the lower surface of the interconnection substrate 110, and are not provided on the layers of the interconnection substrate 110 that face the side surfaces of the acoustic wave device 130 as well as the layers thereof that are lower than the lower surface thereof. The above interconnections have reduced lengths between the terminals.

The terminals 123a and 142a are input terminals to which a signal output by the PA 126 is input. The terminals 117a and 147b are output terminals through which a signal filtered by the acoustic wave device 130 is output. The input terminals 123a and 142a are located at the upper-surface side of the acoustic wave device 130, and the output terminals 117a and 147b are located at the lower-surface side of the acoustic wave device 130. As compared with an arrangement in which the input and output terminals are provided at an identical surface side, the distances between the input and output terminals are large. Interference between the input and output signals is suppressed, and the frequency characteristic of the acoustic wave device 130 is thus improved.

The conductive layer 152 is a ring-shaped conductive layer provided along the edges on the lower surface of the package substrate 131. The conductive layer 153 is a ring-shaped conductive layer provided along the edges on the upper surface of the package substrate 132. The conductive layers 152 and 153 are bonded together by the seal ring 137. As illustrated in FIG. 15B, the seal ring 137 surrounds the IDTs 134 and the reflectors 136, which are thus sealed hermetically. As illustrated in FIG. 14B, the conductive layer 152 is connected to the ground layer 143 through the via interconnections 146. The conductive layer 153 is connected to the ground layer 148 through the via interconnections 151.

The arrangement of the PA 126 on the interconnection substrate 110 increases the degree of integration of module. An electronic component other than the PA 126 may be provided. The electronic component may be an active component such as a switch, a power amplifier and an integrated circuit. The electronic component may be a passive component such as an inductor, a capacitor and a resistor. Since the acoustic wave device and the electronic component are provided on the same substrate, downsizing of module is achieved. Further, the interconnections between the acoustic wave device and the module can be shortened, and loss of signal is thus suppressed.

The insulative layers 111 through 116 may be made of resin such as glass epoxy resin or an insulator such as ceramic. The conductive layers 117 through 123, the seal ring 137 and the via interconnections may be made of a metal such as Cu and Au. The piezoelectric substrate 133 is made of a piezoelectric substance such as $LiNbO_3$ and $LiTaO_3$. The IDTs 134 and the reflectors 136 are made of a metal such as Al. The bumps are formed by solder including a major component of Sn—Ag or Au.

Figure 16A:
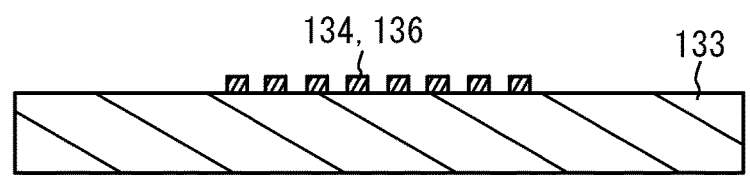
FIGS. 16A through 16C are cross-sectional views that illustrate an exemplary method for fabricating an electronic device.

FIGS. 16A through 17C are cross-sectional views that illustrate an exemplary method for fabricating the acoustic wave device 130. In FIGS. 16A through 16C, the piezoelectric substrate 133 illustrated in FIGS. 14A and 14B are upside down.

Figure 16B:
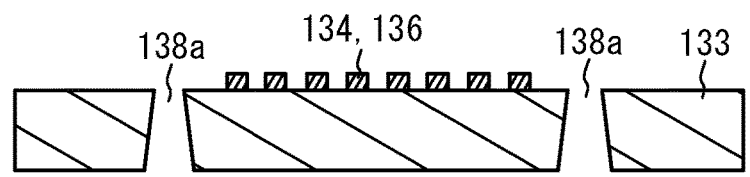
Figure 16C:
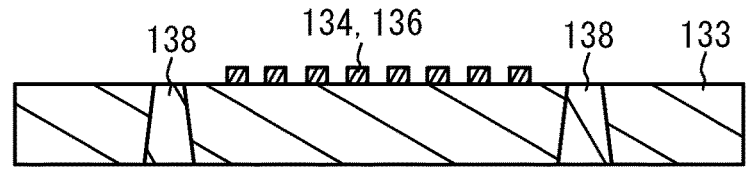

Referring to FIG. 16A, the IDTs 134 and the reflectors 136 are formed on the surface of the piezoelectric substrate 133 by evaporation and liftoff, for example. Referring to FIG. 16B, through holes 138a are formed in the piezoelectric substrate 133 by laser. Referring to FIG. 16C, the via interconnections 138 with which the through holes 138a are filled are formed by plating.

Figure 17A:
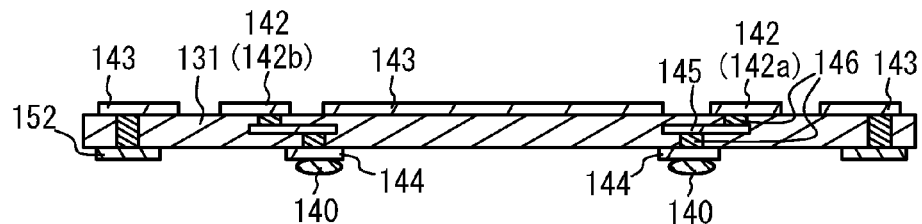
FIGS. 17A through 17C are cross-sectional views of steps that follow those of FIGS. 16A through 16C.
Figure 17B:
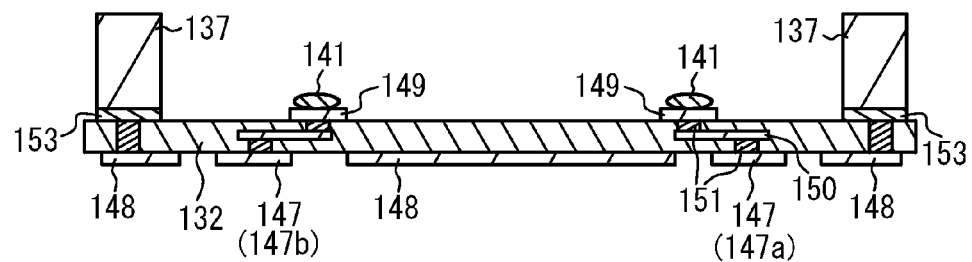
Figure 17C:
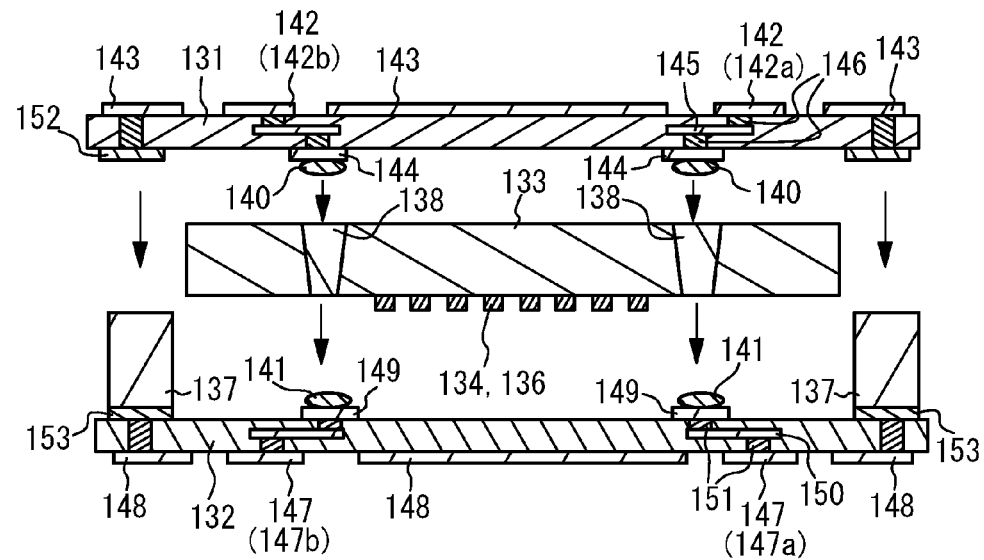

Referring to FIG. 17A, bumps 140 are bonded to the conductive layer 144 of the package substrate 131 by Au—Au bonding, bonding with brazing filler, or room-temperature bonding, for example. Referring to FIG. 17B, the seal ring 137 is bonded to the conductive layer 153 of the package substrate 132, and bumps 141 are bonded to the conductive layer 149. Referring to FIG. 17C, the piezoelectric substrate 133 is sandwiched between the package substrates 131 and 132. As indicated by arrows, the bumps 140 and 141 are bonded to the via interconnections 138, and the seal ring 137 is bonded to the conductive layer 152. The acoustic wave device 130 thus manufactured is buried in the interconnection substrate 110.

Figure 18:
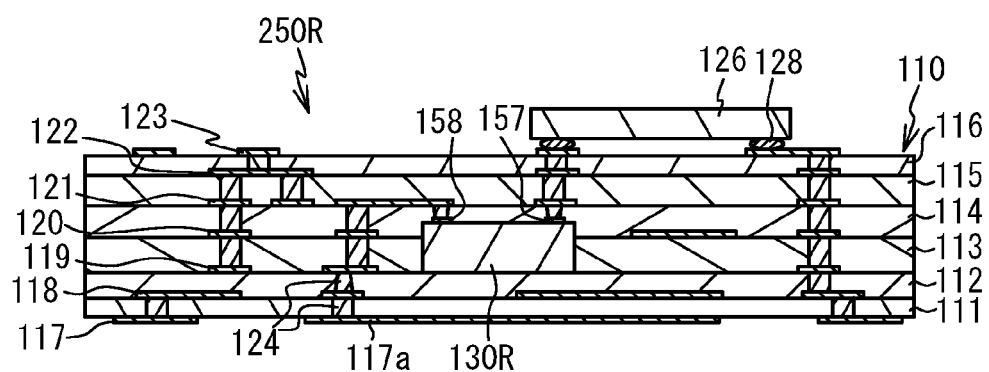
FIG. 18 is a cross-sectional view of an exemplary module in accordance with a comparative example.

FIG. 18 is a cross-sectional view of a module 250R in accordance with a comparative example. Referring to FIG. 18, an acoustic wave device 130R is built in the interconnection substrate 110. Terminals 157 and 158 of the acoustic wave device 130R are provided on the upper surface of the acoustic wave device 130R. An interconnection that connects the terminal 158 and the terminal 117a on the lower surface of the interconnection substrate 110 together is arranged so as to bypass the acoustic wave device 130R. This arrangement decreases the design flexibility. Further, the terminal-to-terminal interconnections in the comparative example are larger than those in the third embodiment. This increases loss of signal and leads to a difficulty in setting the impedance of the interconnections to a desired value.

Fourth Embodiment

Figure 19:
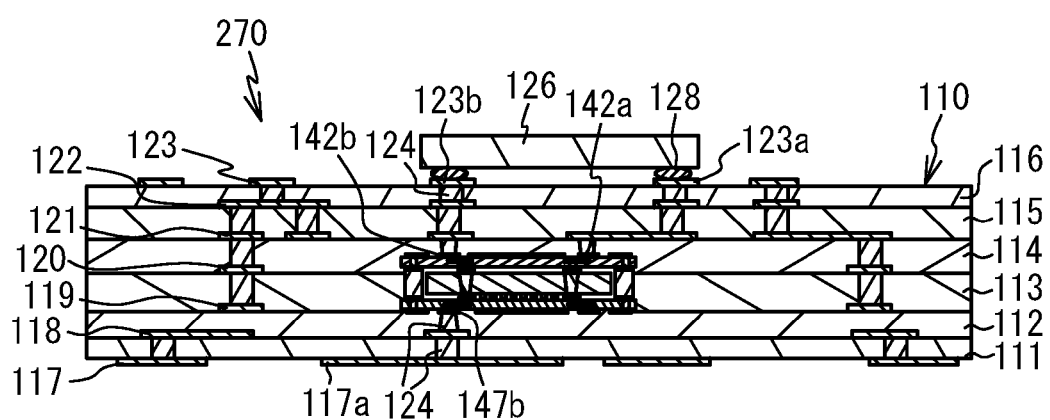
FIG. 19 is a cross-sectional view of an exemplary module in accordance with a fourth embodiment.

FIG. 19 is a cross-sectional view of a module 270 in accordance with a fourth embodiment. Referring to FIG. 19, the terminal 142a provided on the upper surface of the acoustic wave device 130 is connected to the terminal 123a provided on the upper surface of the interconnection substrate 110. The terminal 142b is connected to the terminal 123b. The terminal 147b provided on the lower surface of the acoustic wave device 130 is connected to the terminal 117a provided on the lower surface of the interconnection substrate 110. The terminals 123a and 123b are connected to the PA 126. A signal output from the PA 126 is input to the acoustic wave device 130 through the terminals 123a and 142a. The terminals 117a, 123b, 142b and 147b function as ground terminals.

According to the fourth embodiment, there is no need to arrange the interconnections for bypassing as in the case of the third embodiment, whereby the design flexibility is improved. The interconnections between the terminals are shortened, and loss of signal is reduced. The terminals 117a and 147b and the terminals 123b and 142b are interconnected through the via interconnections 138 formed in the acoustic wave device 130, and are at the same potentials. Thus, the ground potential is stabilized. The terminals 123b and 142b may be used as terminals for supplying the PA 126 with power.

Fifth Embodiment

Figure 20:
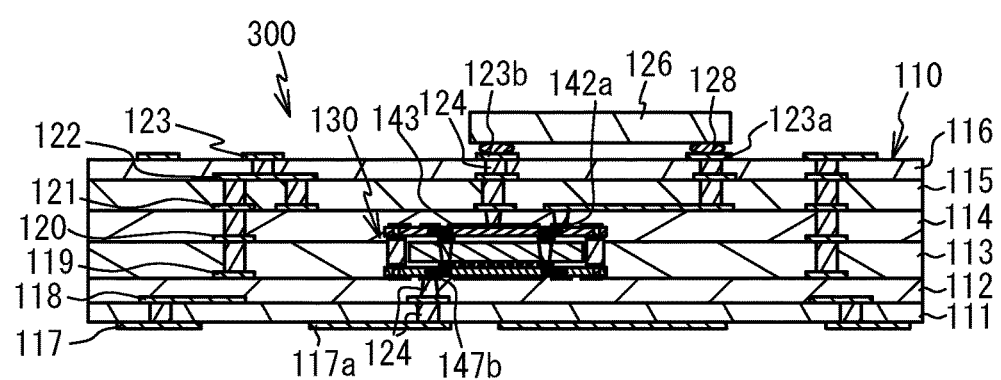
FIG. 20 is a cross-sectional view of an exemplary module in accordance with a fifth embodiment.

FIG. 20 is a cross-sectional view of an exemplary module 300 in accordance with a fifth embodiment. Referring to FIG. 20, the terminal 142a is connected to the terminal 123a. The ground layer 143 provided on the upper surface of the acoustic wave device 130 is connected to the terminal 123b. The terminal 147b is connected to the terminal 117a. The terminals 123a and 142a function as input terminals. The terminals 117a, 123b and 147b function as ground terminals. According to the fifth embodiment, the interconnections between the terminals are shortened, whereby the design flexibility is improved and loss of signal is reduced. Since the terminal 123b is connected to the ground layer 143 of the acoustic wave device 130, there is no need to have the ground interconnections bypass the acoustic wave device 130. Thus, the design flexibility is improved.

Sixth Embodiment

Figure 21:
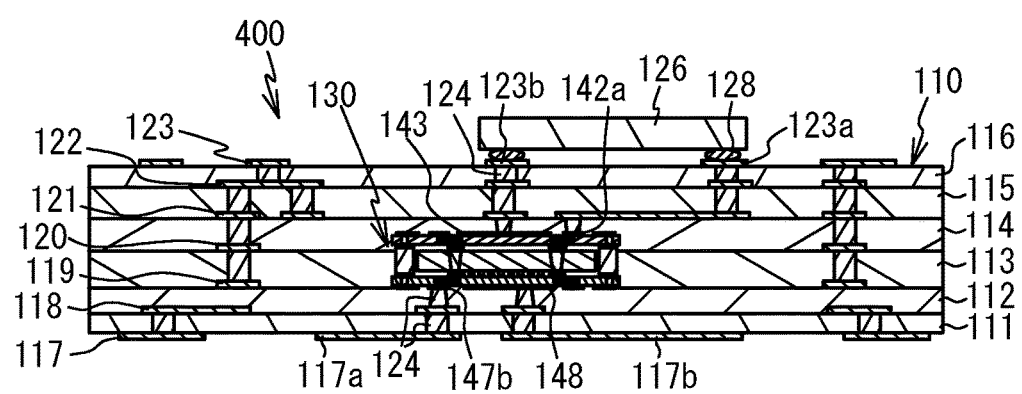
FIG. 21 is a cross-sectional view of an exemplary module in accordance with a sixth embodiment.

FIG. 21 is a cross-sectional view of a module 400 in accordance with a sixth embodiment. Referring to FIG. 21, the terminal 142a is connected to the terminal 123a, and the ground layer 143 is connected to the terminal 123b. The terminal 147b provided on the lower surface of the acoustic wave device 130 is connected to the terminal 117a. The ground layer 148 is connected to the terminal 117b included in the conductive layer 117. According to the sixth embodiment, the design flexibility is improved and loss of signal is reduced.

The terminals 123a and 142a at the upper-surface side of the acoustic wave device 130 function as input terminals. The terminals 117a and 147b at the lower-surface side of the acoustic wave device 130 function as output terminals. Since interference between the input and output signals is suppressed, the frequency characteristic of the module 400 is improved. The terminals 117b and 123b function as ground terminals. The terminal 123b is connected to the ground layer 143 of the acoustic wave device 130, and the terminal 117b is connected to the ground layer 148. Thus, the design flexibility is improved.

Seventh Embodiment

Figure 22A:
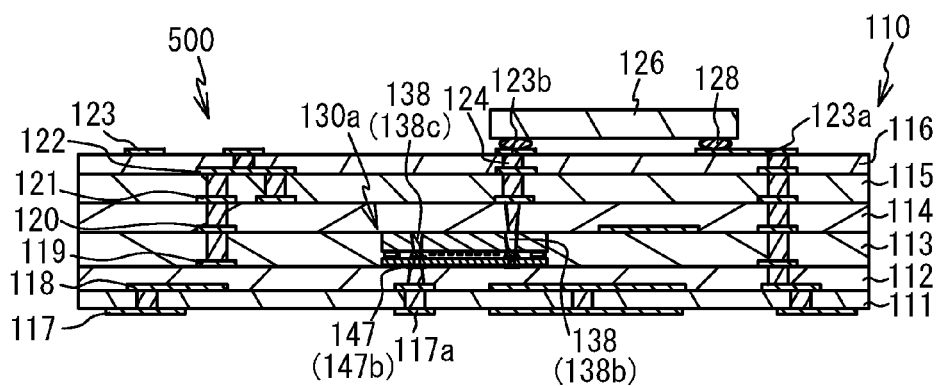
FIG. 22A is a cross-sectional view of an exemplary module in accordance with a seventh embodiment.
Figure 22B:
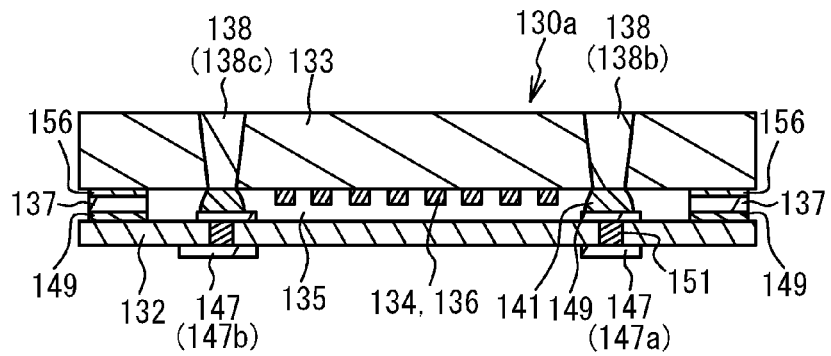
FIG. 22B is a cross-sectional view of an exemplary acoustic wave device included in the module.
Figure 23A:
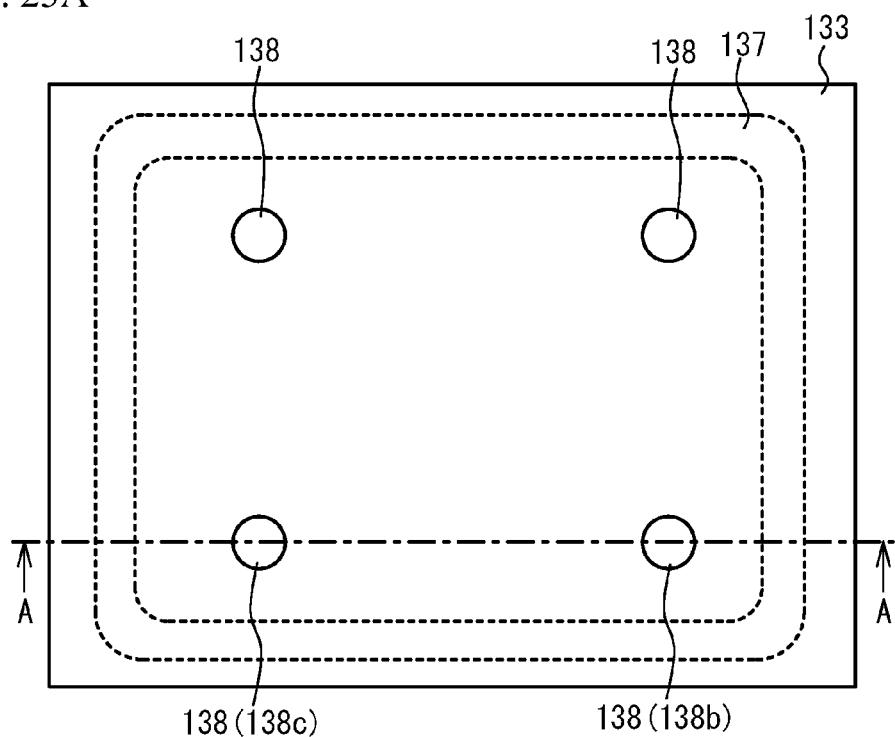
FIG. 23A is a top view of an acoustic wave device.
Figure 23B:
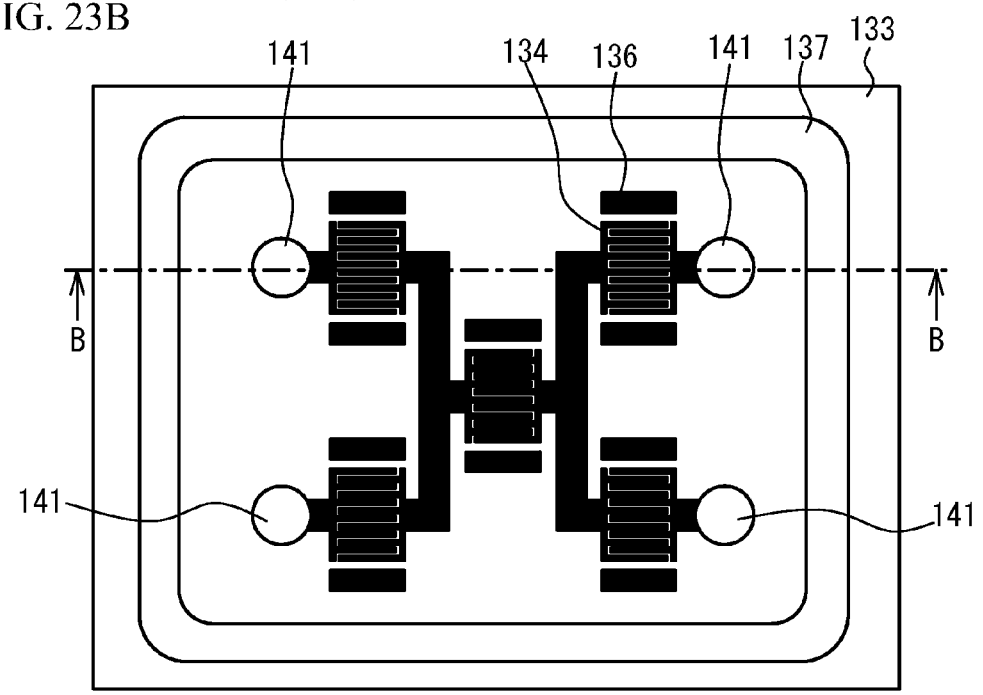
FIG. 23B is a bottom view of an exemplary acoustic wave device seen through a package substrate.

FIG. 22A is a cross-sectional view of a module 500 in accordance with a seventh embodiment. FIG. 22B is a cross-sectional view of an acoustic wave device 130a included in the module 500. FIG. 23A is a top view of the acoustic wave device 130a. FIG. 23B is a bottom view of the acoustic wave device 130a seen through the package substrate 132.

As illustrated in FIG. 22A, the acoustic wave device 130a is built in the interconnection substrate 110. As illustrated in FIG. 22B, the acoustic wave device 130a includes the package substrate 132 and the piezoelectric substrate 133. On the lower surface of the piezoelectric substrate 133, there are provided the IDTs 134, the reflectors 136 and a conductive layer 156. The conductive layer 156 is bonded to the conductive layer 149 provided on the upper surface of the package substrate 132 by the seal ring 137. A gap 135 is formed between the piezoelectric substrate 133 and the package substrate 132. As illustrated in FIGS. 23A and 23B, the seal ring 137 surrounds the IDTs 134 and the reflectors 136.

As illustrated in FIG. 23A, the upper surfaces of the four via interconnections 138 are exposed from the upper surface of the piezoelectric substrate 133. The top surfaces of the via interconnections function as terminals. In FIGS. 22A and 22B, only via interconnections 138b and 138c out of the four via interconnections 138 are illustrated. The via interconnection 138b is connected to the terminal 123b provided on the upper surface of the interconnection substrate 110 through the conductive layers 121 and 122 and the via interconnections 124. The terminal 123b is connected to the PA 126. The via interconnection 138c is connected to the terminal 147b provided on the lower surface of the package substrate 132. The terminal 147b is connected to the terminal 117a on the interconnection substrate 110.

The terminals on the upper surface of the acoustic wave device 130a are connected to the terminals on the upper surface of the interconnection substrate 110, and the terminals on the lower surface of the acoustic wave device 130a are connected to the terminals on the lower surface of the interconnection substrate 110. According to the seventh embodiment, the design flexibility is improved and loss of signal is reduced. The terminals 123b and the via interconnection 138b function as input terminals. The terminals 117a and 147b function as output terminals. Since the distances between the input and output terminals are large, and interference between the input and out signals is suppressed. The acoustic wave device 130a can be miniaturized so as to be as small as the piezoelectric substrate 133, and the flexibility of design of the module 500 is much improved. As illustrated in FIG. 22A, the terminal 123b is connected to the via interconnection 138b. Thus, there is no need to arrange interconnection lines that bypass the acoustic wave device 130a. The terminal 117a is connected to the terminal 147b. Thus, there is no need to arrange ground interconnections that bypass the acoustic wave device 130a. Thus, the design flexibility is improved. Terminals that are electrically connected to the upper surfaces of the via interconnections 138 may be provided on the upper surface of the piezoelectric substrate 133.

Figure 24A:
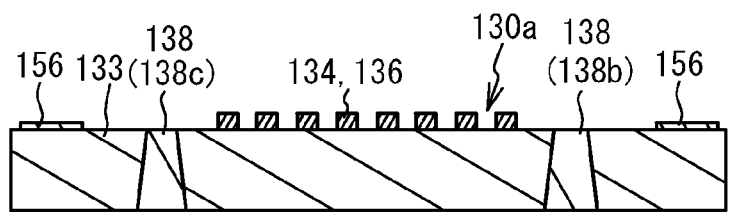
FIGS. 24A through 24C are cross-sectional views that illustrate an exemplary method for fabricating an acoustic wave device.
Figure 24B:
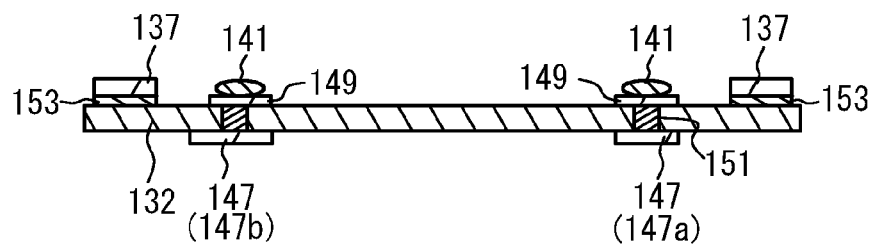
Figure 24C:
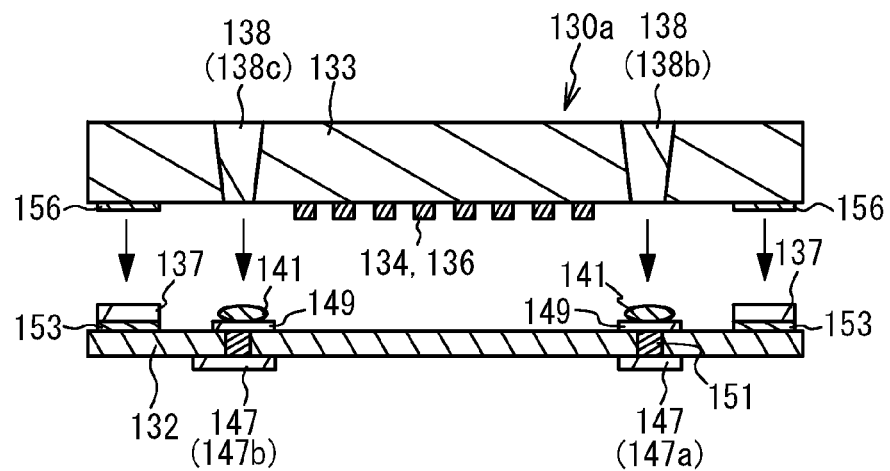

FIGS. 24A through 24C are cross-sectional views that illustrate a method for fabricating the acoustic wave device 130a. Referring to FIG. 24A, the IDTs 134, the reflectors 136 and the conductive layer 156 are formed on the surface of the piezoelectric substrate 133. Referring to FIG. 24B, the seal ring 137 is bonded to the conductive layer 153 of the package substrate 132. The bumps 141 are bonded to the conductive layer 149. Referring to FIG. 24C, the piezoelectric substrate 133 is mounted on the package substrate 132.

Eighth Embodiment

Figure 25:
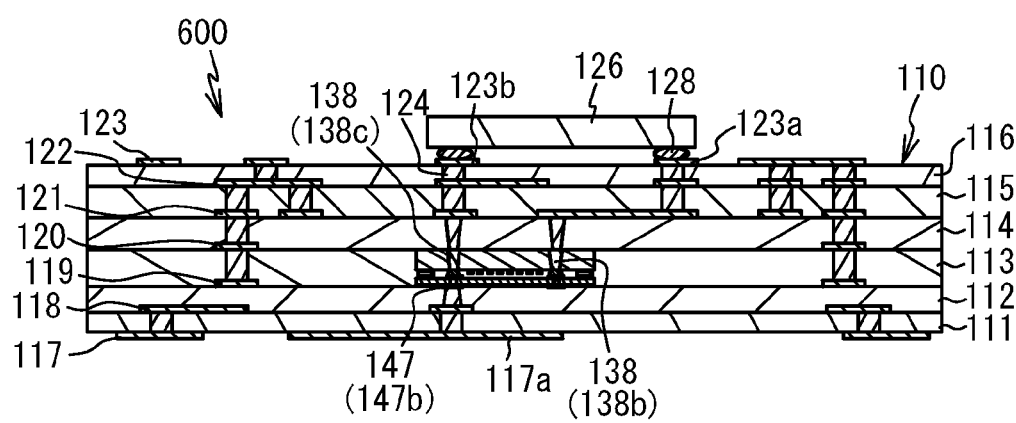
FIG. 25 is a cross-sectional view of an exemplary module in accordance with an eighth embodiment.

FIG. 25 is a cross-sectional view of a module 600 in accordance with an eighth embodiment. Referring to FIG. 25, the via interconnection 138b is connected to the terminal 123a. The via interconnection 138c is connected to the terminal 123b. The terminal 147b is connected to the terminal 117a. The terminal 123a and the upper surface of the via interconnection 138b function as input terminals. The terminals 117a, 123b and 147b and the upper surface of the via interconnection 138c function as ground terminals. According to the eighth embodiment, the design flexibility is improved and loss of signal is reduced.

Figure 26A:
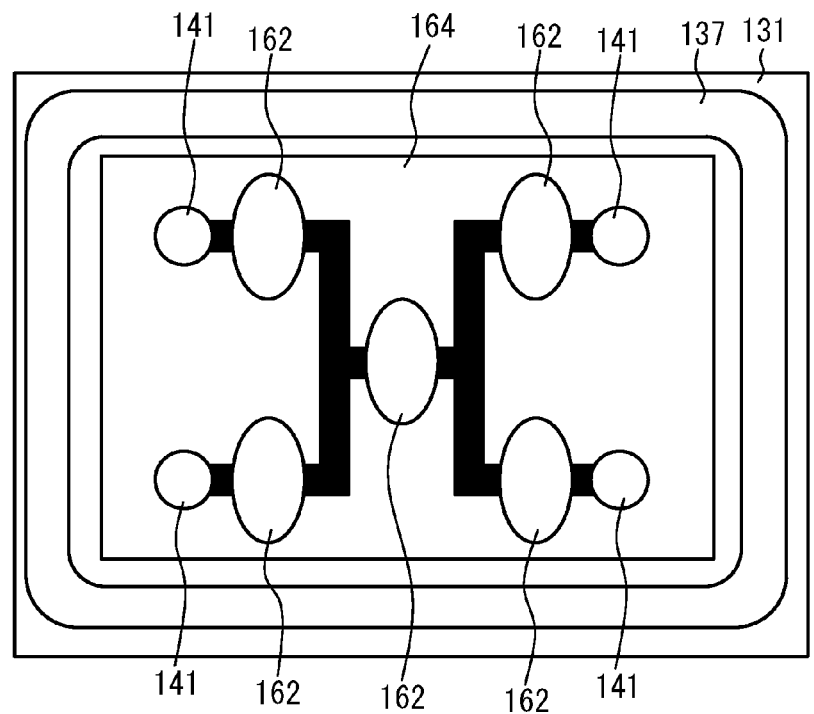
FIG. 26A is a plan view of an exemplary acoustic wave device including an FBAR.

The present invention is not limited to the specific embodiments described above but may include other embodiments and variations within the scope of the claimed invention. The acoustic wave device is not limited to the SAW device but may be a device that includes an acoustic boundary wave device or an FBAR. FIG. 26A is a plan view of an exemplary acoustic wave device 130b that includes FBARs. As illustrated in this figure, multiple FBARs 162 are formed on a substrate 164.

Figure 26B:
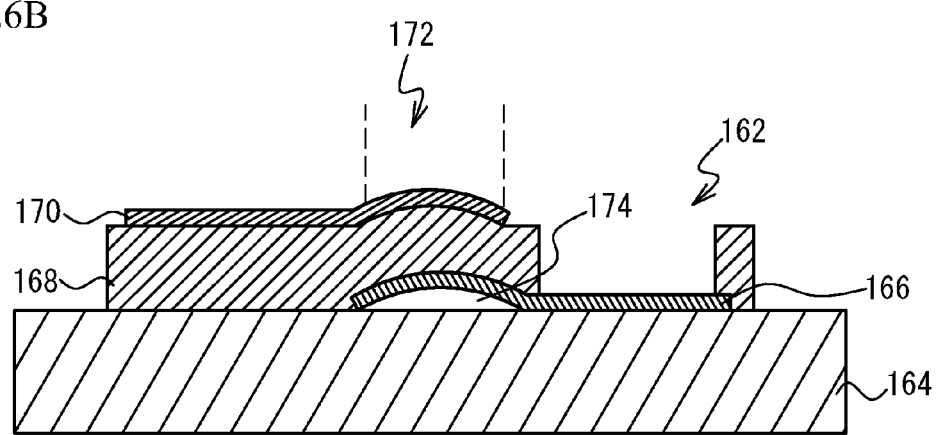
FIG. 26B is a cross-sectional view of an FBAR.

FIG. 26B is a cross-sectional view of one of the FBARs 162. Referring to this figure, a lower electrode 166, a piezoelectric thin film 168 and an upper electrode 170 are stacked on the substrate 164. A resonance section 172 in which the lower electrode 166, the piezoelectric thin film 168 and the upper electrode 170 overlap with each other is a function part that excites acoustic waves. The resonance section 172 is raised upwards in a dome shape, and a gap 174 is formed between the lower electrode 166 and the substrate 164. The lower electrode 166 may be exposed to the gap 174. An acoustic reflection film may be attached to the lower surface of the lower electrode 166. The substrate 164 may be made of silicon or glass, for example. The lower electrodes 166 and the upper electrodes 170 may be made of a metal such as Ru. The piezoelectric thin film 168 may be made of a piezoelectric substrate such as AN, ZnO, PZT, and $PbTiO_3$. The gap 135 is formed between the resonance section 172 and the package substrate 132 illustrated in FIG. 14B. Excitation of acoustic waves is not prevented due to the presence of the gaps 135 and 174.

Figure 27:
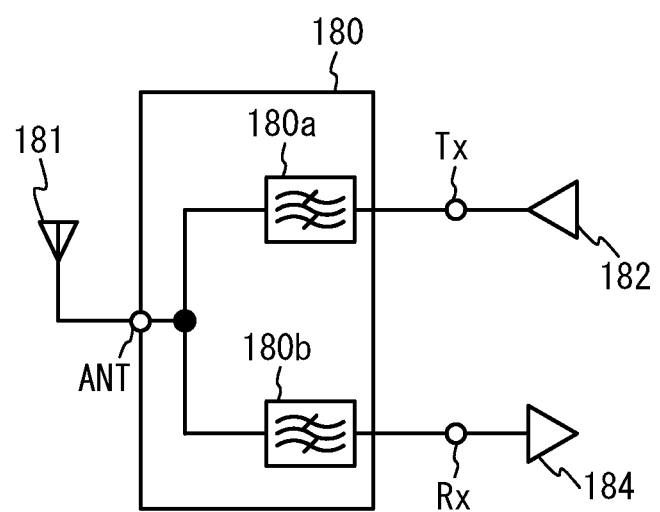
FIG. 27 is a block diagram of an exemplary module including a duplexer.

FIG. 27 is a block diagram of an exemplary module that includes a duplexer 180. Referring to FIG. 27, the duplexer 180 includes a transmit filter 180a and a receive filter 180b. The transmit filter 180a is connected to an antenna 181 through an antenna terminal ANT, and is connected to a PA 182 through a transmit terminal Tx. The receive filter 180b is connected to the antenna 181 via the antenna terminal ANT, and is connected to an LNA 184 through a receive terminal Rx. RF signals are sent and received through the antenna 181. Any of the acoustic wave devices of the third through eighth embodiments may be used as the transmit filter 180a or the receive filter 180b. Any of the terminals 142 and 147 and the terminals included in the conductive layer 117 and 123 may be used as the transmit filter Tx or the receive filter Rx. Multiple acoustic wave devices that form the duplexer 180 may be buried in the interconnection substrate 110. Any of the terminals included in the conductive layer 117 or 123 may be used as any of the transmit terminal Tx, the receive terminal Rx and the antenna terminal ANT. Interference between signals may be suppressed by providing two of the transmit terminal Tx, the receive terminal Rx and the antenna terminal ANT on the upper surface of the interconnection substrate 110 and providing the remaining terminal on the lower surface thereof. Instead of the PA 126 illustrated in FIG. 14A, an integrated circuit including the PA 182 and LNA 184 illustrated in FIG. 27 may be provided.

What is claimed is:

1. A module comprising:
   an electronic device comprising:
      a first substrate;
      a first function part formed on a first surface of the first substrate;
      an adhesive layer formed on the first surface so as to surround the first function part;
      a second substrate that is bonded to the first substrate by the adhesive layer so as to form a gap between the first and second substrates;
      a first via interconnection that pierces the first substrate to connect the first surface and a second surface of the first substrate opposite to the first surface together;
      a second via interconnection that pierces the second substrate to connect a third surface of the second substrate opposite to the first substrate and a fourth surface of the second substrate opposite to the third surface together;
      a first terminal that is provided on the second surface and is connected to the first via interconnection; and
      a second terminal that is provided on the fourth surface and is connected to the second via interconnection,
      the first function part being connected to at least one of the first via interconnection and the second via interconnection,
   an interconnection substrate in which the electronic device is buried;
   a third terminal that is provided on a fifth surface of the interconnection substrate closer to the second surface;
   a fourth terminal that is provided on a sixth surface of the interconnection substrate closer to the fourth surface;
   a first interconnection line that connects the third terminal to the first terminal, is located between the second surface and the fifth surface and does not pass through a region of the interconnection substrate located just beside the electronic device; and
   a second interconnection line that connects the fourth terminal to the second terminal, is located between the fourth surface and the sixth surface and does not pass through the region of the interconnection substrate.

2. The module according to claim 1, further comprising a second function part that is provided on the third surface and is connected to at least one of the first via interconnection and the second interconnection.

3. The module according to claim 2, wherein the first and second function parts are an acoustic wave device or a passive element.

4. The module according to claim 3, further comprising:
a transmit filter connected between a transmit terminal and an antenna terminal; and
a receive filter connected between a receive terminal and the antenna terminal, wherein:
the transmit filter includes one of the first and second function parts;
the receive filter includes the other of the first and second function parts;
one of the first and second terminals includes a plurality of terminals; and
one of the first and second terminals includes two of the transmit terminal, the receive terminal and the antenna terminal, and the other includes one of the transmit terminal, the receive terminal and the antenna terminal other than the two.

5. The module according to claim 2, wherein:
the first and second substrates include piezoelectric substrates; and
the first and second function parts include interdigital transducers.

6. The module according to claim 2, wherein:
one of the first and second substrates includes a piezoelectric substrate;
one of the first and second function parts that is provided on the piezoelectric substrate is an interdigital transducer; and
the other of the first and second function parts is a resonance section of a film bulk acoustic resonator.

7. The module according to claim 2, wherein the first and second function parts include resonance sections of film bulk acoustic resonators.

8. The module according to claim 2, wherein:
the second via interconnection extends up to the first surface of the first substrate and is connected to a fifth terminal provided on the first surface;
the first via interconnection extends up to the third surface of the second substrate and is connected to a sixth terminal provided on the third surface; and
the first function part is connected to the second via interconnection through the fifth terminal, and the second function part is connected to the first via interconnection through the sixth terminal.

9. The module according to claim 1, wherein the adhesive layer includes two layers.

10. The module according to claim 1, wherein an RF signal is outputted from the third terminal and/or the fourth terminal, or is received by the third terminal and/or the fourth terminal.

11. A module comprising:
an interconnection substrate;
an acoustic wave device buried in the interconnection substrate;
a first terminal provided on a first surface of the acoustic wave device;
a second terminal provided on a second surface of the acoustic wave device opposite to the first surface;
a third terminal provided on a third surface of the interconnection substrate closer to the first surface and is connected to the first terminal;
a fourth terminal provided on a fourth surface of the interconnection substrate closer to the second surface and is connected to the second terminal;
a first interconnection that connects the first terminal to the third terminal, is located between the first surface and the third surface and does not pass through a region of the interconnection substrate located just beside the acoustic wave device; and
a second interconnection that connects the second terminal to the fourth terminal, is located between the second surface and the fourth surface and does not pass through the region of the interconnection substrate,
wherein the first terminal is one of an input terminal to which an RF signal is input and an output terminal from which an RF signal outputs, and
wherein the second terminal is the other of the input terminal and the output terminal.

12. The module according to claim 11, further comprising a via interconnection provided in the acoustic wave device and connecting the first terminal to the second terminal,
wherein the first and second terminals are at an identical potential.

13. The module according to claim 11, further comprising an electronic device provided on one of the third and fourth surfaces of the interconnection substrate and connected to one of the third and fourth terminals.

14. The module according to claim 11, wherein the acoustic wave device is one of a filter and a duplexer.

15. The module according to claim 12, wherein:
the acoustic wave device includes a substrate, a function part that is provided on a surface of the substrate and excites an acoustic wave, and a package substrate;
a gap is formed between the surface of the substrate and the package substrate; and
the function part is exposed to the gap, and is connected to the first and second terminals.

* * * * *